United States Patent
Ohnuma et al.

(10) Patent No.: US 8,518,797 B2
(45) Date of Patent: Aug. 27, 2013

(54) METHOD OF MAKING AN SOI SUBSTRATE BY USING A SEPARATION LAYER WITH REGIONS OF NON-UNIFORM CONCENTRATION

(75) Inventors: Hideto Ohnuma, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 282 days.

(21) Appl. No.: 12/212,990

(22) Filed: Sep. 18, 2008

(65) Prior Publication Data

US 2009/0081850 A1    Mar. 26, 2009

(30) Foreign Application Priority Data

Sep. 21, 2007  (JP) ................. 2007-245603

(51) Int. Cl.
    *H01L 21/46*          (2006.01)
(52) U.S. Cl.
    USPC ........... 438/458; 438/455; 438/677; 438/977; 257/E21.122; 257/E21.568
(58) Field of Classification Search
    USPC ......... 438/458, 455, 677, 977; 257/E21.122, 257/E21.568
    See application file for complete search history.

(56) References Cited

U.S. PATENT DOCUMENTS

| | | | |
|---|---|---|---|
| 5,371,037 A | 12/1994 | Yonehara | |
| 5,750,000 A | 5/1998 | Yonehara et al. | |
| 5,840,616 A | 11/1998 | Sakaguchi et al. | |
| 5,854,123 A | 12/1998 | Sato et al. | |
| 5,966,620 A * | 10/1999 | Sakaguchi et al. | 438/455 |
| 6,054,363 A | 4/2000 | Sakaguchi et al. | |
| 6,362,076 B1 | 3/2002 | Inazuki et al. | |
| 6,372,609 B1 | 4/2002 | Aga et al. | |
| 6,380,046 B1 | 4/2002 | Yamazaki | |
| 6,566,278 B1 * | 5/2003 | Harvey et al. | 438/778 |
| 6,703,254 B2 * | 3/2004 | Saitoh et al. | 438/29 |
| 6,803,264 B2 * | 10/2004 | Yamazaki et al. | 438/151 |
| 7,056,808 B2 * | 6/2006 | Henley et al. | 438/458 |
| 7,199,024 B2 | 4/2007 | Yamazaki | |
| 7,300,853 B2 * | 11/2007 | Joly et al. | 438/406 |
| 2004/0147095 A1 * | 7/2004 | Yamazaki | 438/479 |
| 2007/0173043 A1 * | 7/2007 | Lee et al. | 438/514 |
| 2007/0178679 A1 * | 8/2007 | Hatem et al. | 438/514 |

(Continued)

FOREIGN PATENT DOCUMENTS

| | | |
|---|---|---|
| JP | 11-163363 | 6/1999 |
| JP | 11-307472 | 11/1999 |

*Primary Examiner* — Mark A Laurenzi
(74) *Attorney, Agent, or Firm* — Eric J. Robinson; Robinson Intellectual Property Law Office, P.C.

(57) ABSTRACT

The method includes steps of adding first ions to a predetermined depth from a main surface of a semiconductor substrate by irradiation of the semiconductor substrate with a planar, linear, or rectangular ion beam, so that a separation layer is formed; adding second ions to part of the separation layer formed in the semiconductor substrate; disposing the main surface of the semiconductor substrate and a main surface of a base substrate to face each other in order to bond a surface of an insulating film and the base substrate; and cleaving the semiconductor substrate using the separation layer as a cleavage plane, so that a single crystal semiconductor layer is formed over the base substrate. The mass number of the second ions is the same as or larger than that of the first ions.

36 Claims, 13 Drawing Sheets

(56) References Cited

U.S. PATENT DOCUMENTS

| | | | |
|---|---|---|---|
| 2007/0281399 A1* | 12/2007 | Cites et al. | 438/149 |
| 2008/0088543 A1* | 4/2008 | Shibusawa | 345/76 |
| 2008/0179547 A1* | 7/2008 | Henley | 250/492.21 |
| 2008/0286937 A1* | 11/2008 | Mitani | 438/458 |

* cited by examiner

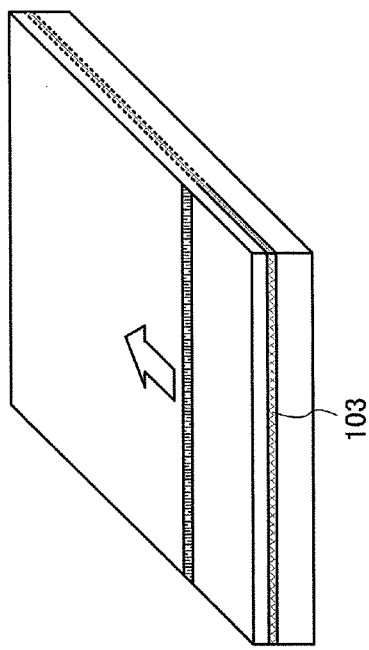
FIG. 3A2
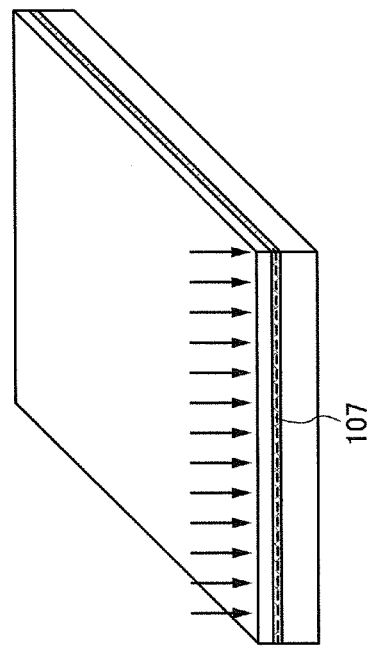
FIG. 3B2
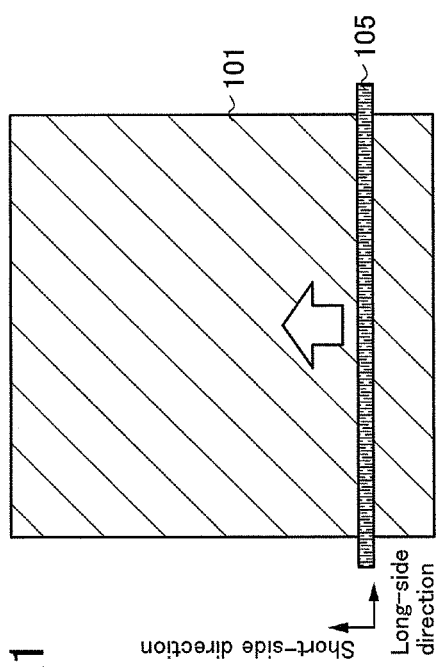
FIG. 3A1
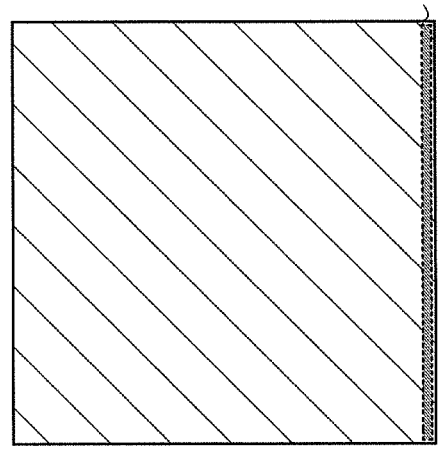
FIG. 3B1

(110) plane (100) plane

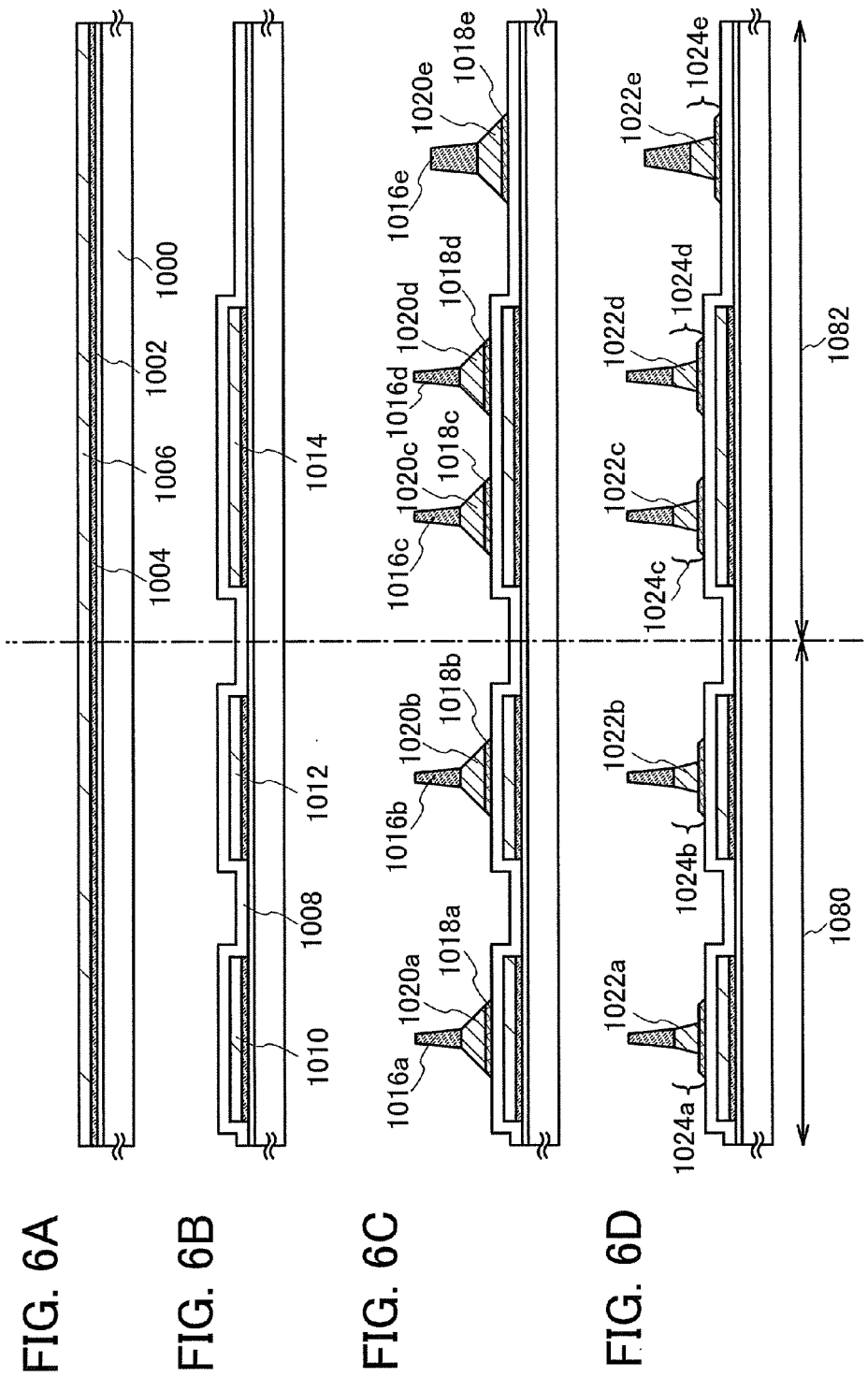

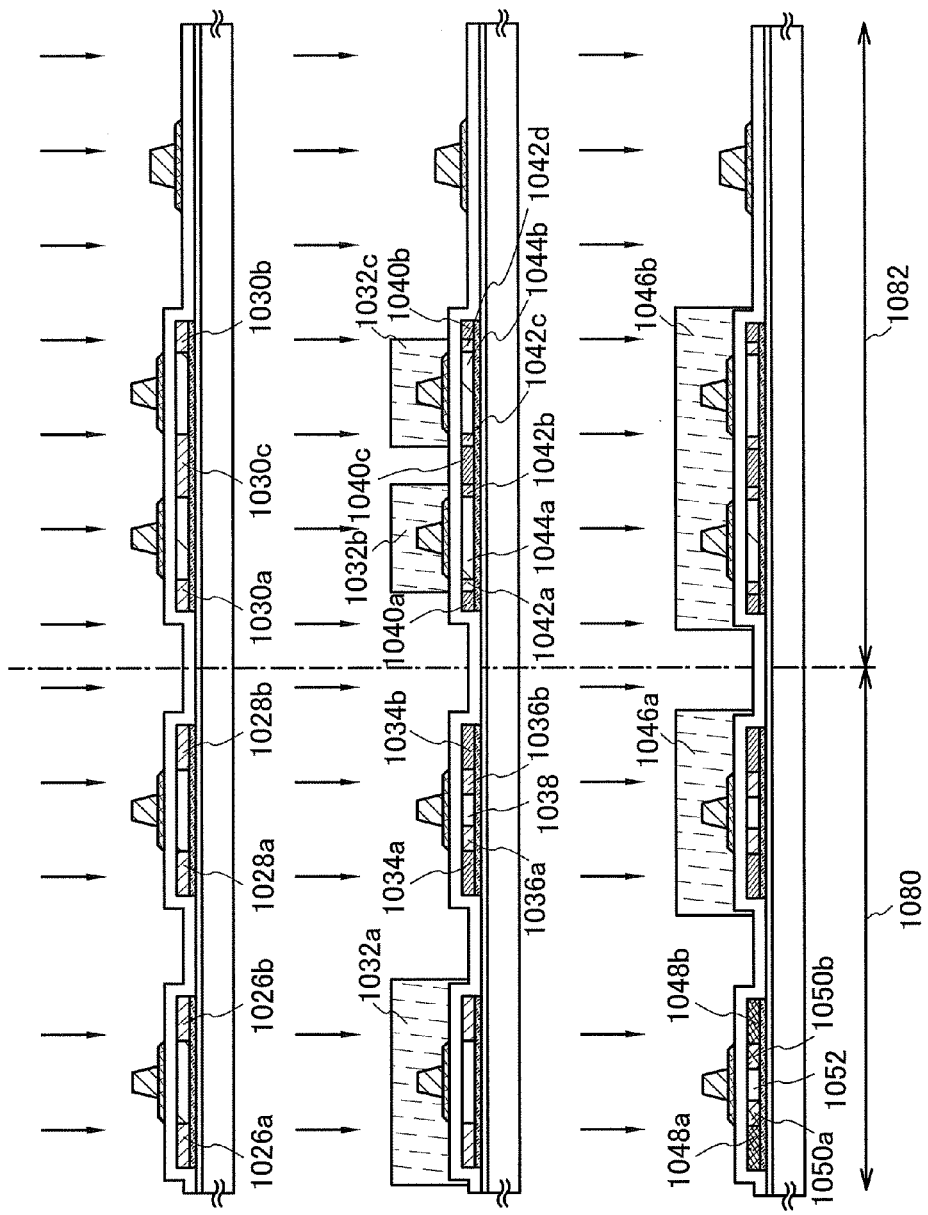

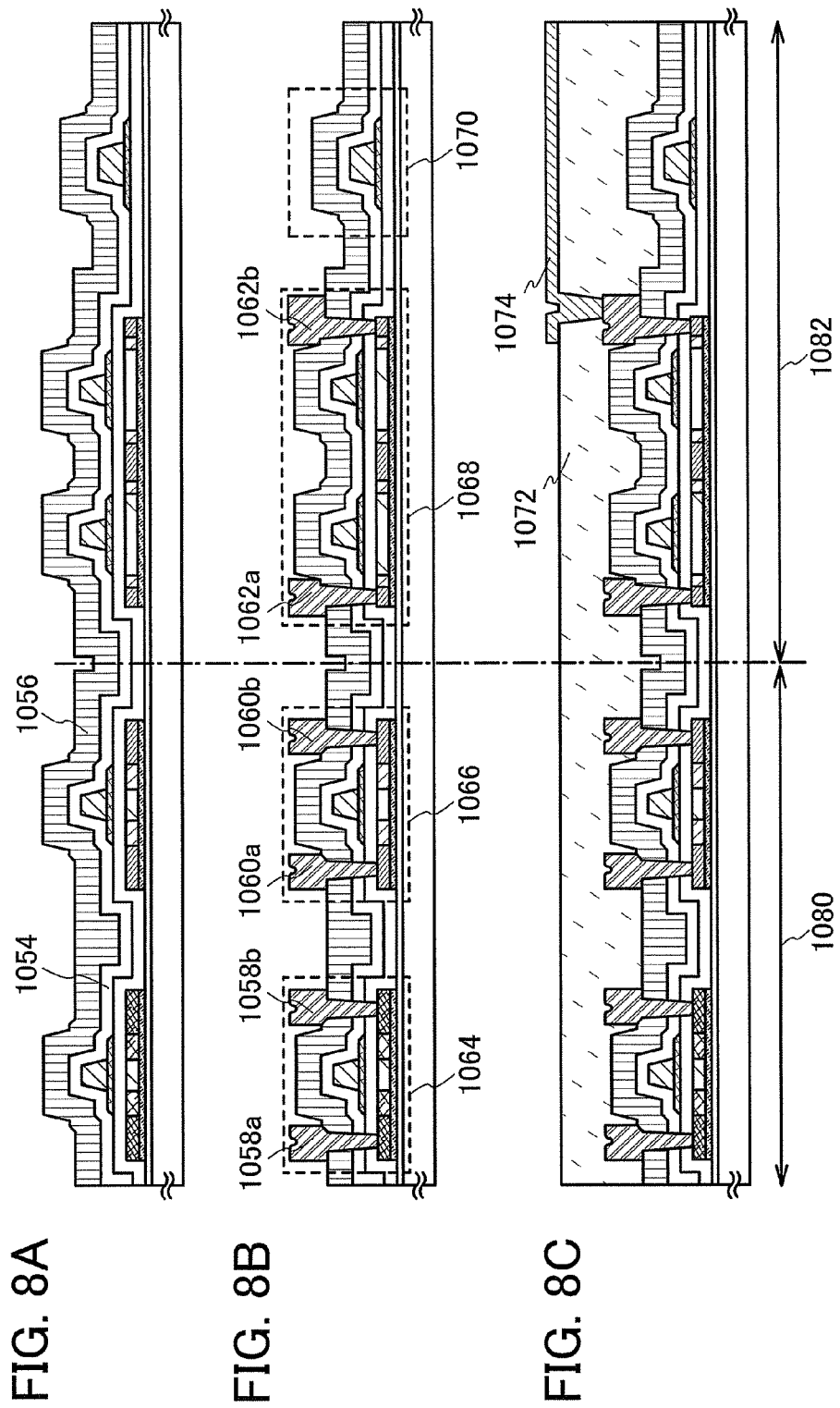

METHOD OF MAKING AN SOI SUBSTRATE BY USING A SEPARATION LAYER WITH REGIONS OF NON-UNIFORM CONCENTRATION

BACKGROUND OF THE INVENTION

1. Field of the Invention

The present invention relates to a silicon-on-insulator (SOI) substrate. The present invention also relates to a semiconductor device manufactured using the SOI substrate.

2. Description of the Related Art

Recently, integrated circuits using an SOI (Silicon on Insulator) substrate where a thin single crystal semiconductor layer is formed on an insulating surface, instead of bulk-like silicon wafers, have been developed. Since parasitic capacitance between a drain of a transistor and a substrate is reduced by using the SOI substrate, the SOI substrate has attracted attention as one improving performance of semiconductor integrated circuits.

A Smart Cut method is known as one of methods for manufacturing an SOI substrate. An outline method for manufacturing an SOI substrate by a Smart Cut method is described below. First, hydrogen ions are implanted into a silicon wafer by an ion implantation method so that an ion implantation layer is formed at a predetermined depth from a surface. Next, the silicon wafer into which the hydrogen ions are implanted is bonded to another silicon wafer with a silicon oxide film interposed therebetween. After that, the ion implantation layer becomes a cleavage plane by performing heat treatment, and the wafer into which the hydrogen ions are implanted is separated into a thin film state, whereby a silicon film can be formed over the bonded silicon wafer. A Smart Cut method may be referred to as a hydrogen ion implantation separation method.

In a hydrogen ion implantation separation method, ions are separated by mass and then electromagnetically deflected to scan (raster scan) a fixed substrate, whereby ion implantation is performed. Therefore, concentration distribution of hydrogen atoms included on a surface of a semiconductor substrate varies depending on locations, and projections and depressions are generated on a surface of a cleaved silicon film. When a gate insulating film is formed over the silicon film whose surface has large projections and depressions, the projections and depressions penetrate the gate insulating film, causing a problem of leakage between a semiconductor layer and a gate electrode.

Accordingly, Chemical Mechanical Polishing (CMP) is performed on the surface of the silicon film with projections and depressions generally after cleavage. Further, a technique in which the surface of the silicon film is flattened by performing heat treatment in the hydrogen atmosphere after cleavage is disclosed in Reference 1 (Japanese Published Patent Application No. H11-307472).

Furthermore, as an example of a technique in which a single crystal silicon thin film is formed over a glass substrate by such Smart Cut, a technique by the present applicant has been known (for example, Reference 2: Japanese Published Patent Application No. H11-163363).

SUMMARY OF THE INVENTION

A glass substrate is more inexpensive and be prepared with larger area than a silicon wafer. Thus, the glass substrate is mainly used for manufacturing a liquid crystal display device. When a glass substrate is used as a base substrate, an inexpensive and large-sized SOI substrate can be manufactured.

However, the glass substrate has lower heat resistance than the silicon wafer. Therefore, an SOI substrate to which a separated single crystal silicon layer is bonded cannot be heated at a temperature which exceeds the upper temperature limit of the glass substrate, and the process temperature in manufacturing an SOI substrate is restricted.

For the reason that the process temperature is restricted, when ions are excessively implanted to the semiconductor substrate by increasing dose of ions in order to cleave the semiconductor substrate easily at a low temperature, there is a possibility that the single crystal semiconductor layer after separation has many defects.

In addition, an apparatus and a processing method to which the substrate can be applied are naturally limited because the substrate has a large size. For example, it is difficult to attain high throughput at low cost when projections and depressions of the single crystal silicon layer which is bonded to a large-sized glass substrate are removed by polishing treatment such as CMP. This is because the glass substrate and the silicon wafer have different shapes and sizes, and so on.

In the foregoing problems, it is an object of the present invention to provide a method for manufacturing an SOI substrate, in which a semiconductor substrate can be separated while maintaining flatness of a separated plane even when separation is performed by cleavage of the semiconductor substrate. It is another object to provide a method for manufacturing an SOI substrate provided with a semiconductor layer which can be used for practical application even when a substrate having a low upper temperature limit, such as a glass substrate or the like, is used. It is further another object to manufacture a highly reliable semiconductor device using such an SOI substrate.

In the present invention, addition of ions to the semiconductor substrate is performed at least twice by addition of first ions and addition of second ions. Hereinafter, the present invention is specifically described.

An aspect of a method for manufacturing an SOI substrate of the present invention is to include steps of: adding a first ion to a predetermined depth from a surface of a single crystal semiconductor substrate by irradiation of the single crystal semiconductor substrate with a planar, linear, or rectangular ion beam, so that a separation layer is formed; adding a second ion to a part of the separation layer formed in the single crystal semiconductor substrate; disposing a surface of the single crystal semiconductor substrate and a surface of a base substrate to face each other in order to bond a surface of an insulating layer formed over the single crystal semiconductor substrate and the surface of the base substrate; and cleaving the single crystal semiconductor substrate using the separation layer as a cleavage plane, so that a single crystal semiconductor layer is formed over the base substrate. A mass number of the second ion is the same as or larger than a mass number of the first ion.

Another aspect of a method for manufacturing an SOI substrate of the present invention is to include steps of: forming a nitrogen-containing layer over a surface of a single crystal semiconductor substrate; adding a first ion to a predetermined depth from a surface of the single crystal semiconductor substrate by irradiation of the single crystal semiconductor substrate with a planar, linear, or rectangular ion beam through the nitrogen-containing layer, so that a separation layer is formed; adding a second ion to a part of the separation layer formed in the single crystal semiconductor substrate; forming an insulating layer over the nitrogen-containing layer; disposing the surface of a single crystal semiconductor substrate and a surface of a base substrate to face each other in order to bond a surface of the insulating layer and the surface of the base substrate; and cleaving the single crystal semiconductor substrate using the separation layer as a cleavage plane, so that a single crystal semiconductor layer is formed over the base substrate. A mass number of the second ion is the same as or larger than a mass number of the first ion.

Another aspect of a method for manufacturing an SOI substrate of the present invention is to include steps of: forming an oxide film over a surface of a single crystal semiconductor substrate by performing heat treatment in an oxidative atmosphere containing halogen; adding a first ion to a predetermined depth from the surface of the single crystal semiconductor substrate by irradiation of the single crystal semiconductor substrate with a planar, linear, or rectangular ion beam through the oxide film, so that a separation layer is formed; adding a second ion to a part of the separation layer formed in the single crystal semiconductor substrate; forming an insulating layer over a surface of the oxide film; disposing the surface of the single crystal semiconductor substrate and a surface of a base substrate to face each other in order to bond a surface of the insulating layer and the surface of the base substrate; and cleaving the single crystal semiconductor substrate using the separation layer as a cleavage plane, so that a single crystal semiconductor layer is formed over the base substrate. A mass number of the second ion is the same as or larger than a mass number of the first ion.

In the above structure of the method for manufacturing and SOI substrate of the present invention, the first ion is added by an ion doping method, and the second ion is added by an ion implantation method.

Note that in this specification, an ion doping method means a technique in which ions are accelerated by an electric field and introduced into a semiconductor without mass separation, and an ion implantation method means a technique in which ions are separated by mass, and only ions with specific mass are accelerated by an electric field and introduced into a semiconductor.

Note that a semiconductor device in this specification generally indicates a device capable of functioning by utilizing semiconductor characteristics, and electro-optic devices, semiconductor circuits, and electronic devices are all semiconductor devices.

Further, a display device in this specification includes a light-emitting device and a liquid crystal display device. The light-emitting device includes a light-emitting element, and the liquid crystal display device includes a liquid crystal element. A light-emitting element includes, in its scope, an element whose luminance is controlled by current or voltage, and specifically includes an inorganic electroluminescence (EL) element, an organic EL element, and the like.

In accordance with the present invention, separation can be performed while maintaining flatness of a separation plane. In addition, when a substrate having a low upper temperature limit, such as a glass substrate is used, an SOI substrate provided with a semiconductor layer which can be used for practical applications can be manufactured.

BRIEF DESCRIPTION OF THE DRAWINGS

FIGS. 3A1 to 3A2 and 3B1 to 3B2 are diagrams illustrating an example of a manufacturing method of an SOI substrate of the present invention.

FIGS. 6A to 6D are cross-sectional views illustrating an example of a manufacturing method of a semiconductor device using an SOI substrate of the present invention.

FIGS. 7A to 7C are cross-sectional views illustrating an example of a manufacturing method of a semiconductor device using an SOI substrate of the present invention.

FIGS. 8A to 8C are cross-sectional views illustrating an example of a manufacturing method of a semiconductor device using an SOI substrate of the present invention.

DETAILED DESCRIPTION OF THE INVENTION

Figure 1A:
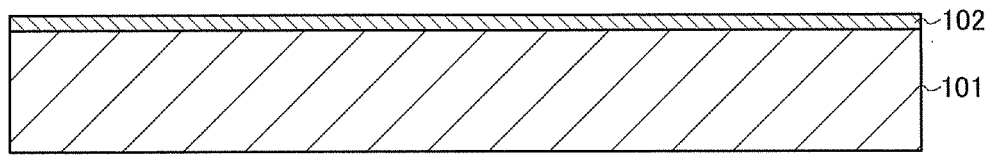
FIGS. 1A to 1D are diagrams illustrating an example of a manufacturing method of an SOI substrate of the present invention.

Embodiment modes of the invention will be described below with reference to the drawings. However, the present invention can be implemented in various different ways and it will be easily understood by those skilled in the art that various changes and modifications are possible without departing from the purpose and scope of the present invention. Therefore, the present invention should not be construed as being limited to the description in the following embodiment modes. In the following description, like reference numerals are used to designate identical portions or portions having a similar function in different drawings for illustrating embodiment modes, and thus their repetitive description will be omitted.

Embodiment Mode 1

This embodiment mode describes an example of a method for manufacturing an SOI substrate with reference to drawings. Specifically, a method for manufacturing an SOI substrate is described, in which after ions are added to a semiconductor substrate plural times, separation is performed in a state where the semiconductor substrate is bonded to a base substrate. Hereinafter, a case where ions are added twice by adding first ions and adding second ions will be described.

First, a semiconductor substrate 101 is prepared, and a nitrogen-containing layer 102 is formed over a surface of the semiconductor substrate 101 (see FIG. 1A).

As the semiconductor substrate 101, a commercial semiconductor substrate can be used; for example, a single crystal silicon substrate, a single crystal germanium substrate, and a compound semiconductor substrate of gallium arsenide, indium phosphide, and the like can be used. As commercial silicon substrates, typically, substrates which are 5 inches in diameter (125 mm), 6 inches in diameter (150 mm), 8 inches in diameter (200 mm), and 12 inches in diameter (300 mm)

are given, which are generally circular. Note that the silicon substrate is not limited to have a circular shape, and a silicon substrate processed to have a rectangular shape or the like can be used.

The nitrogen-containing layer 102 functions as a barrier layer later to prevent impurities such as a movable ion, moisture, and the like contained in the base substrate from diffusing into a semiconductor layer having a single crystal structure (hereinafter, referred to as "single crystal semiconductor layer") which is provided by bonding part of the semiconductor substrate 101 to the base substrate. Thus, the nitrogen-containing layer 102 is not necessarily provided depending on a material to be used for the base substrate.

The nitrogen-containing layer 102 is formed to have a single-layer structure or a stacked structure using a silicon nitride layer, a silicon nitride oxide layer, or a silicon oxynitride layer by a chemical vapor deposition (hereinafter, referred to as CVD) method, a sputtering method, or the like. The nitrogen-containing layer 102 is preferably formed to have a thickness equal to or greater than 50 nm and equal to or less than 200 nm. For example, the nitrogen-containing layer 102 can be obtained by stacking a silicon oxynitride layer and a silicon nitride oxide layer from the semiconductor substrate 101 side.

In this specification, silicon oxynitride contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Next, first ions accelerated by an electric field are added to a predetermined depth from the surface of the semiconductor substrate 101, so that a separation layer 103 is formed (see FIG. 1B, FIG. 3A1, and FIG. 3A2). Note that FIG. 3A1 is a top view, and FIG. 3A2 is a perspective view of FIG. 3A1.

In this embodiment mode, the first ions are added to the semiconductor substrate 101 using an ion doping apparatus. In other words, a doping method in which plural ions produced by exciting a source gas into plasma are added to the semiconductor substrate 101 without mass separation is used.

Further, the first ions can be added by irradiation with a planar or linear ion beam. Here, a case is shown, in which the semiconductor substrate 101 is irradiated with an ion beam 105 whose cross section has a linear shape (including a rectangular shape) as shown in FIGS. 3A1 and 3A2.

In the case of using a linear ion beam, the semiconductor substrate 101 is moved relative to the short-side direction of the linear ion beam 105, whereby the first ions can be added to the predetermined depth of the semiconductor substrate 101. As the length in the long-side direction of the ion beam 105 is set to be longer than the length of the side (a side parallel to the long-side direction of the ion beam 105) of the semiconductor substrate 101 to be irradiated, the ions can be added to the semiconductor substrate 101 efficiently.

Although the case of using a rectangular semiconductor substrate is shown here, in a case of using a circular silicon wafer as the semiconductor substrate 101, the length in the long-side direction of the ion beam 105 may be set to be longer than the diameter of the silicon wafer, and the semiconductor substrate 101 may be moved relative to a short-side direction of the ion beam 105.

As compared with the case of adding ions to a large area at one time, addition of ions to the semiconductor substrate 101 by irradiation with a linear ion beam enables distribution of ion addition to have uniformity. This is because two dimensional uniformity (in the long-side direction and the short-side direction) of distribution of ion addition is required in the case of adding ions to a large area at one time, but uniformity only in the long-side direction is required in the case of adding ions by scanning with a linear ion beam.

Next, second ions are added to part of the separation layer 103 formed in the semiconductor substrate 101, so that a high concentration region 107 is formed (see FIG. 1C, FIG. 3B1, and FIG. 3B2). Note that, FIG. 3B1 is a top view, and FIG. 3B2 is a perspective view of FIG. 3B1.

The high concentration region 107 contains atoms at high concentration (e.g., a hydrogen atom or the like) because ions are added intensively, and functions as a trigger (starting point) for separation later when the semiconductor substrate 101 is separated using the separation layer 103 as a cleavage plane. Thus, the second ions are added to not an entire surface of the semiconductor substrate 101 but part of the region where the first ions are added. Here, an example is shown, in which the high concentration region 107 is provided to have a linear shape in part of the separation layer 103 provided at the edge of the semiconductor substrate 101.

Further, the second ions can be added using an ion implantation apparatus. In other words, an ion implantation method can be used, in which plural ions produced by exciting a source gas into plasma are separated by mass, and only specific ions are implanted. In the case of using an ion implantation method, the second ions are added by scanning with a spot ion beam 106; thus, there is a possibility that variation in concentration of atoms to be contained in the semiconductor substrate or the like is generated depending on portions. However, the second ions are partly added, and the high concentration region 107 formed by addition of the second ions functions as a trigger for separation; therefore, effect due to variation in distribution of ion addition is small.

When only specific ions obtained by mass separation are added, variation in the direction of a depth in the semiconductor substrate can be suppressed; therefore, a position where the high concentration region 107 is formed is easily controlled.

Figure 13:
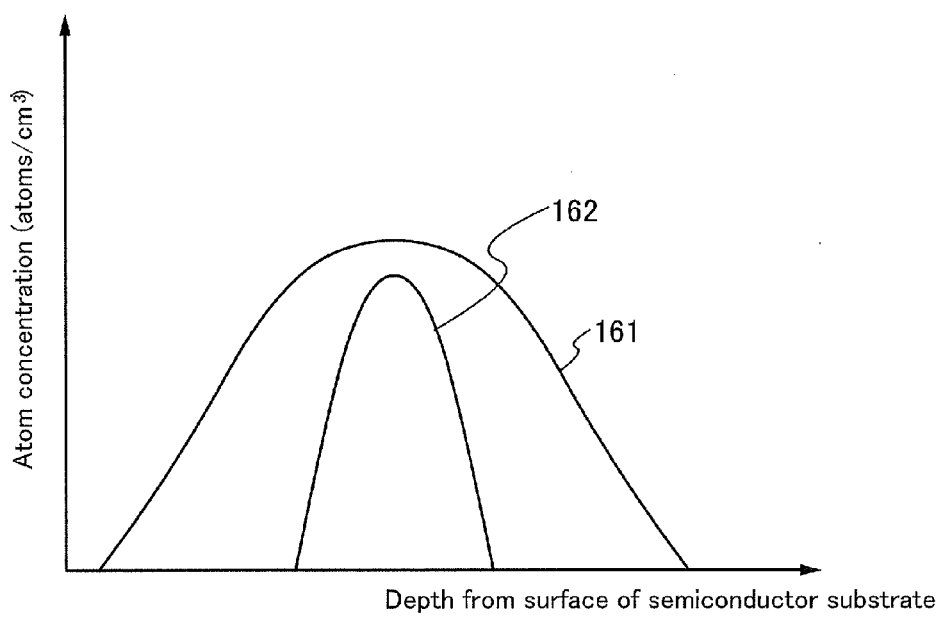
FIG. 13 is a schematic diagram of concentration distribution of hydrogen atoms in a direction of a depth in a semiconductor substrate.

FIG. 13 schematically shows concentration distribution of hydrogen atoms in the direction of a depth from the surface of the semiconductor substrate 101 when the first ions are added using $H^+$, $H_2^+$, and $H_3^+$ without mass separation, and the second ions are added using $H_3^+$ obtained by mass separation. In FIG. 13, plots 161 indicate concentration of hydrogen atoms in the direction of a depth in the semiconductor substrate 101 based on addition (doping) of the first ions, and plots 162 indicate concentration of hydrogen atoms contained in the direction of a depth in the semiconductor substrate 101 based on addition (implantation) of the second ions. When only specific ions obtained by mass separation are added, variation in the direction of a depth in the semiconductor substrate can be suppressed; thus, the second ions are added by an ion implantation method, so that a portion where the high concentration region 107 functioning as a trigger (starting point) for separation is provided can be accurately controlled.

Although FIG. 13 shows the case where the peak concentration of hydrogen atoms based on addition of the first ions is higher than the peak concentration of hydrogen atoms based on addition of the second ions, it is not limited thereto. For example, by control of condition of addition of the second ions, the peak concentration of hydrogen atoms based on addition of the second ions can be higher than the peak concentration of hydrogen atoms based on addition of the first ions.

Note that addition of the second ions is not limited to the case of using the ion implantation apparatus. For example, the second ions may be added by irradiating the part of the edge of the semiconductor substrate 101 with a linear or rectangular ion beam.

Since the second ions are added to form the high concentration region 107 functioning as a trigger (starting point) for separation, it is preferable that addition of the second ions be performed using ions with the same mass number as the first ions or with larger mass number than the first ions. Note that the mass number mentioned here indicates the mass number of ions to be added, and in the case of adding plural ions with different mass numbers, the mass number indicates the average mass number of the plural ions. For example, in the case where plural ions with different mass numbers are used as the first ions without mass separation, the mass number indicates the average mass number of the plural ions contained in the ion beam 105.

A large amount of ions of hydrogen or the like are added to increase concentration of hydrogen atoms contained in the separation layer, whereby separation can be performed easily. However, projections and depressions are generated on a surface of a single crystal semiconductor layer after the separation, or defects in the semiconductor layer are increased. Therefore, in this embodiment mode, the separation layer is provided by adding a small amount of ions (the first ion) to the entire surface of the semiconductor substrate 101, and the high concentration region 107 to be a trigger (starting point) for separation is formed selectively by further adding the second ions to part of the semiconductor substrate, so that separation can be easily performed while maintaining flatness of a large part of the separation plane of the single crystal semiconductor layer. That is, concentration of hydrogen atoms contained in the high concentration region 107 is higher than concentration of hydrogen atoms contained in the separation layer 103.

Further, the dose of the second ions may be equal to or greater than 0.3 times and equal to or less than 5 times the dose of the first ions.

Since there is a possibility that projections and depressions are generated on the separation plane of the single crystal semiconductor layer in a portion where the second ions are added or defects in the semiconductor layer is increased, the second ions may be added in a region where an element such as a transistor is not formed later. For example, the second ions are added to part of the separation layer at the edge of the semiconductor substrate 101 to form the high concentration region 107 as shown in FIGS. 3B1 and 3B2.

Figure 4A:
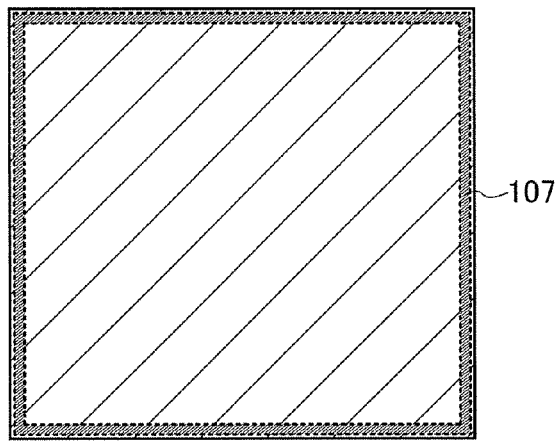
FIGS. 4A to 4C are diagrams each illustrating an example of a manufacturing method of an SOI substrate of the present invention.
Figure 4B:
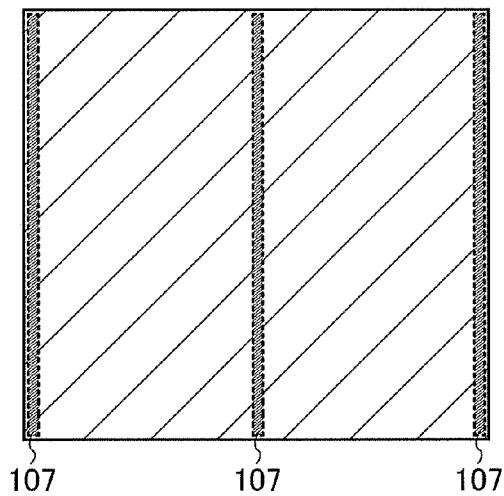
Figure 4C:
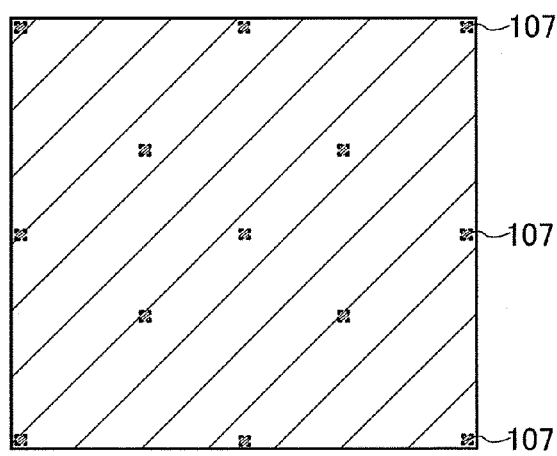

Naturally, the portion where the high concentration region 107 is formed is not limited to the above. For example, the second ions are selectively added to part of the separation layer at the edge of the semiconductor substrate 101 or in the vicinity of the edge of the semiconductor substrate 101, so that a high concentration region 107 in a linear shape can be provided (FIG. 4A). Alternatively, the second ions are selectively added to part of the separation layer at the edge of the semiconductor substrate 101 and on an inner side of the semiconductor substrate 101, so that a plurality of high concentration regions 107 in linear shapes can be provided (FIG. 4B). Further alternatively, the second ions are selectively added to the separation layer in the semiconductor substrate 101, so that a plurality of high concentration regions 107 in dotted shapes are provided (FIG. 4C).

As a source gas used for the first ion addition step and the second ion addition step, for example, a hydrogen gas can be used.

In a case where addition (doping) of a plurality of ions is performed without mass separation, $H^+$, $H_2^+$, and $H_3^+$ are generated from a hydrogen gas ($H_2$ gas). In the case where a hydrogen gas is used for a source gas, it is preferable that $H_3^+$ be the largest number of ions with which the semiconductor substrate 101 is irradiated. Irradiation with $H_3^+$ ions can improve efficiency of ion addition and can shorten ion irradiation time as compared with irradiation with $H^+$ and $H_2^+$. Specifically, it is preferably to contain $H_3^+$ ions at a percentage of 50% or more with respect to the total number of ions of $H^+$, $H_2^+$, and $H_3^+$. Further, it is more preferable to contain $H_3^+$ ions at a percentage of 80% or more.

On the other hand, when ions that are separated by mass are added (implanted), irradiation with ions with large mass number (e.g., $H_3^+$ ions) is performed as selected, so that efficiency of ion addition can be improved and irradiation time can be shortened.

For example, addition of the first ions can be performed using $H^+$, $H_2^+$, and $H_3^+$ in such conditions that the accelerating voltage is set to be equal to or higher than 10 kV and equal to or lower than 100 kV and the dose is set to be equal to or greater than $0.5 \times 10^{16}$ ions/cm$^2$ and equal to or less than $3 \times 10^{16}$ ions/cm$^2$. Addition of the second ions can be performed using $H_3^+$ obtained by mass separation in such conditions that the accelerating voltage is set to be equal to or higher than 10 kV and equal to or lower than 100 kV and the dose is set to be equal to or greater than $0.6 \times 10^{16}$ ions/cm$^2$ and equal to or less than $4 \times 10^{16}$ ions/cm$^2$.

In this case, the high concentration region 107 preferably contains hydrogen atoms which is equal to or higher than $2 \times 10^{21}$ atoms/cm$^3$. Further preferably, the high concentration region 107 contains hydrogen atoms which is equal to or higher than $5 \times 10^{21}$ atoms/cm$^3$. When a region where hydrogen is added at a high concentration is locally formed in the semiconductor substrate 101, the crystal structure is damaged, and microvoids are formed. The volume of the microvoids formed in the high concentration region 107 is changed by heat treatment at a relatively low temperature (equal to or lower than 600° C.), and the semiconductor substrate 101 can be cleaved using the high concentration region 107 as a trigger (starting point).

In order to maintain flatness of the surface of the single crystal semiconductor layer after the separation, the separation layer 103 preferably contains hydrogen at less than $2 \times 10^{21}$ ions/cm$^3$. More preferably, the separation layer 103 contains hydrogen at less than $5 \times 10^{20}$ ions/cm$^3$.

As the source gas in the ion addition step, instead of a hydrogen gas, one or more kinds of gases selected from deuterium, a rare gas such as a helium gas or an argon gas, a halogen gas typified by a fluorine gas or a chlorine gas, and a halogen compound gas such as a fluorine compound gas (e.g., $BF_3$) can be used. When helium is used for a source gas, a linear or rectangular ion beam 105 with high proportion of $He^+$ ions can be formed without mass separation. The semiconductor substrate 101 is irradiated with such an ion beam 105, whereby microvoids can be formed in the separation layer 103 efficiently.

Further, ions of different atom species can be applied as the first ion and the second ion. For example, a hydrogen gas may be used as a source gas for addition of the first ions, and a rare gas such as helium or a halogen gas may be used for addition of the second ions.

Figure 1B:
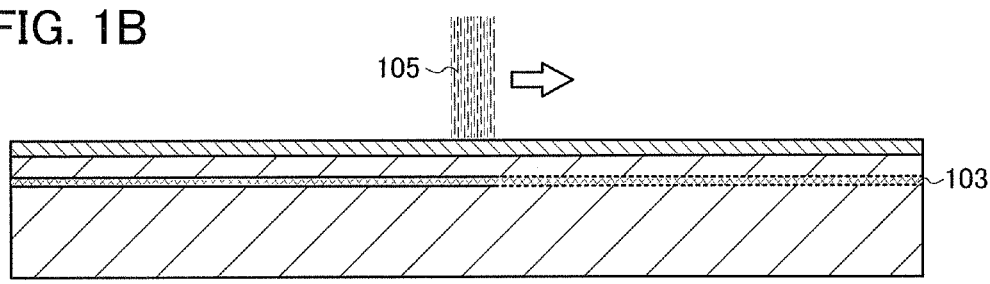
Figure 1C:
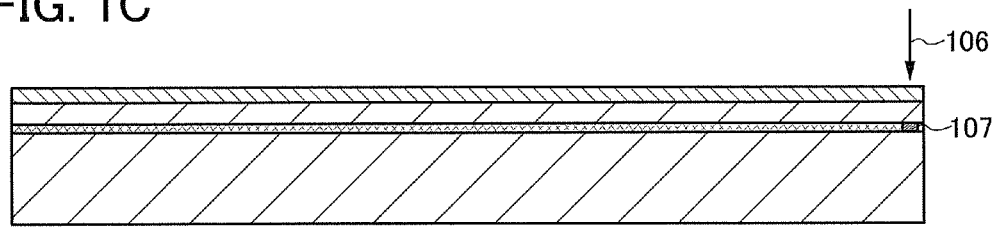

Although this embodiment mode shows the case in which after the first ions are added, the second ions are added, the introduction order of the first ions and the second ions may be reversed (the step shown in FIG. 1B and the step shown in FIG. 1C may be reversed).

Figure 1D:
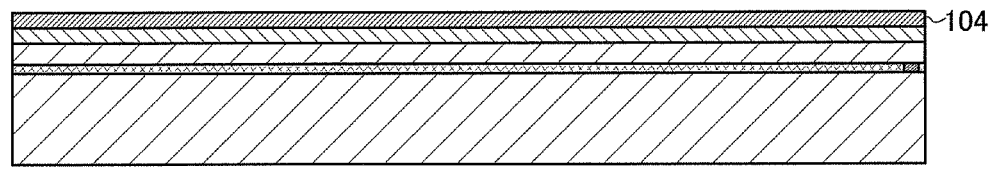

Next, an insulating layer 104 is formed over the semiconductor substrate 101 with the nitrogen-containing layer 102 interposed therebetween (see FIG. 1D).

The insulating layer 104 functions as a bonding layer with a base substrate and is provided on a surface where the semiconductor substrate 101 forms a bond with the base substrate. The insulating layer 104 may have a single-layer structure or a stacked structure. The insulating layer whose surface which forms a bond with the base substrate (hereinafter also referred to as a "bonding surface") has a smooth surface and becomes a hydrophilic surface is preferably used. A silicon oxide layer is suitable for the insulating layer which has a smooth surface and can form a hydrophilic surface. Preferably, average roughness (Ra) of the silicon oxide layer is equal to or less than 0.5 nm, and root-mean-square roughness (Rms) thereof is equal to or less than 0.6 nm. More preferably, mean roughness (Ra) is equal to or less than 0.3 nm, and root-mean-square roughness (Rms) is equal to or less than 0.4 nm. Note that the insulating layer 104 may be formed over the semiconductor substrate 101 before the first ions are added to the semiconductor substrate 101.

In particular, a silicon oxide layer manufactured by a CVD method using organosilane is preferable. This is because a bond between the base substrate and the single crystal semiconductor layer can be firmed with use of the silicon oxide layer formed using organosilane.

Examples of organosilane that can be used include silicon-containing compounds such as tetraethoxysilane (abbreviation: TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (SiH$(OC_2H_5)_3$), and tris(dimethylamino)silane ($SiH(N(CH_3)_2)_3$).

Here, a silicon oxide layer is deposited by a CVD method using organosilane as a source gas over the nitrogen-containing layer 102. Alternatively, a silicon oxide layer or a silicon oxynitride layer deposited by a CVD method using silane as a source gas can be applied. Deposition by a CVD method is performed at a temperature low enough to keep from degassing of the separation layer 103 formed in the semiconductor substrate 101. For example, the deposition temperature is preferably equal to or lower than 350° C. Note that as a temperature of heat treatment by which the single crystal semiconductor layer is separated from the semiconductor substrate 101, a temperature which is higher than a temperature of deposition by a CVD method is applied.

Figure 2A:
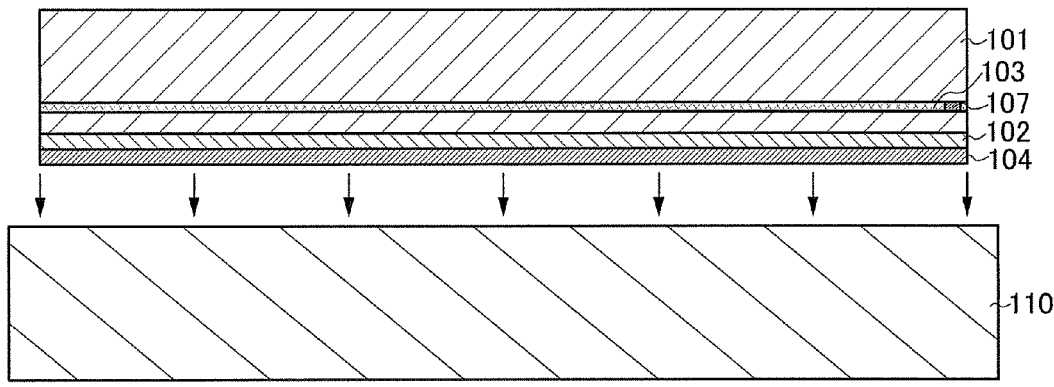
FIGS. 2A to 2C are diagrams illustrating an example of a manufacturing method of an SOI substrate of the present invention.
Figure 2B:
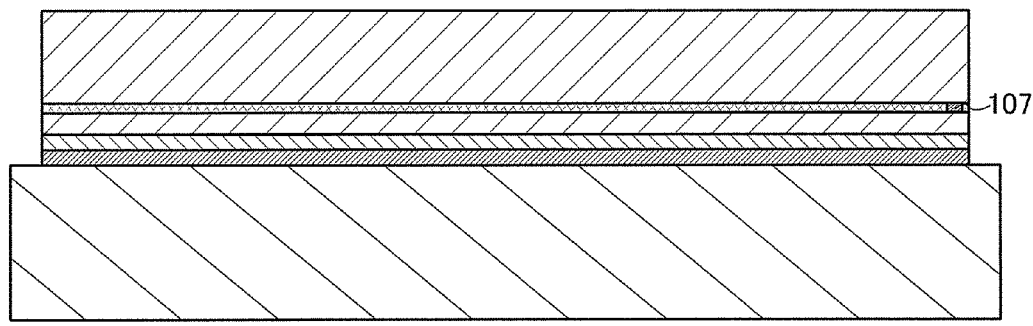

Next, the semiconductor substrate 101 and a base substrate 110 are bonded to each other (see FIG. 2A). A surface of the insulating layer 104 formed over the semiconductor substrate 101 is disposed in contact with a surface of the base substrate 110, thereby forming a bond. This bond is formed under the action of a van der Waals force, and by disposing the base substrate 110 and the semiconductor substrate 101 in contact with each other, a strong bond can be formed by hydrogen bonding. Note that by performing megasonic cleaning, or megasonic cleaning and washing with ozone water before the semiconductor substrate 101 and the base substrate 110 are bonded, dust on the surface of the substrate is removed and the surface can be turned into a hydrophilic surface, which is preferable.

A substrate having an insulating surface is used for the base substrate 110. Specifically, a variety of glass substrates used for electronic industries (e.g., aluminosilicate glass, aluminoborosilicate glass, or barium borosilicate glass), a quartz substrate, a ceramic substrate, or a sapphire substrate can be given as an example. It is preferable to use a glass substrate for the base substrate 110: for example, a large-sized mother glass called the "sixth generation" (1500 mm×1850 mm), the "seventh generation" (1870 mm×2200 mm), or the "eighth generation" (2200 mm×2400 mm) is used. When an SOI substrate is manufactured using a large-sized mother glass for the base substrate 110, the SOI substrate can have a large area. As a result, the number of display panels which are manufactured from one substrate (panels yielded per substrate) can be increased, and accordingly, productivity can be improved.

In order to favorably perform bonding between the base substrate 110 and the insulating layer 104, a bonding surface may be activated. For example, one or both of the surfaces where the bond is formed are irradiated with an atom beam or an ion beam. When an atom beam or an ion beam is used, a neutral atom beam of an inert gas of argon or the like or an ion beam of an inert gas can be used. It is also possible to activate the bonding surface by plasma irradiation or radical treatment. Such surface treatment facilitates forming bonding between different materials even at a temperature which is equal to or lower than 400° C.

After the base substrate 110 and the semiconductor substrate 101 are bonded to each other with the insulating layer 104 interposed therebetween (see FIG. 2B), it is preferable that either heat treatment or pressure treatment or the both be performed. Heat treatment or pressure treatment makes it possible to increase the bonding strength between the base substrate 101 and the semiconductor substrate 101. The heat treatment is performed at a temperature equal to or lower than the upper temperature limit of the base substrate 110. The pressure treatment is performed so that pressure is applied in a direction perpendicular to the bonding surface, in consideration of the pressure resistance of the base substrate 110 and the semiconductor substrate 101.

Figure 2C:
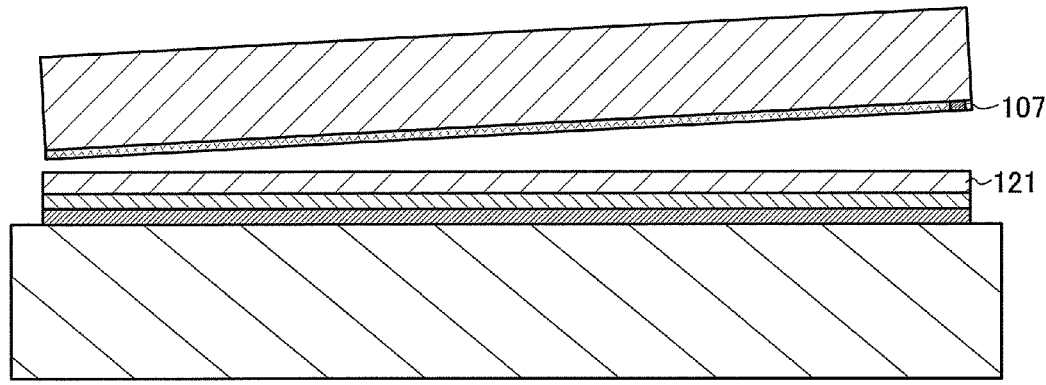

Next, heat treatment is performed, so that part of the semiconductor substrate 101 is separated from the base substrate 110 using the separation layer 103 as a cleavage plane (see FIG. 2C). It is preferable that the heat treatment be performed at a temperature which is equal to or higher than a temperature at which the insulating layer 104 is formed and equal to or lower than the upper temperature limit of the base substrate 110. For example, heat treatment at a temperature equal to or higher than 400° C. and equal to or lower than 600° C. is performed, whereby volume of microvoids formed in the separation layer 103 is changed, and thus separation along the separation layer 103 is possible. Since the insulating layer 104 is bonded to the base substrate 110, a single crystal semiconductor layer 121 having the same crystallinity as the semiconductor substrate 101 is left over the base substrate 110.

Through the above-described steps, an SOI substrate is obtained in which the single crystal semiconductor layer 121 is provided over the base substrate 110 with the insulating layer 104 interposed therebetween.

In the case of using an ion implantation method, variation is generated in distribution of ion addition generally, which causes projections and depressions on a surface of the single crystal semiconductor layer 121 obtained by separation. In order to flatten the surface, it is necessary to perform CMP or heat treatment at a temperature equal to or higher than the upper temperature limit of the glass substrate. On the other hand, in this embodiment mode, a small amount of ions (first ions) is added to the entire surface of the semiconductor substrate so that a separation layer is provided; second ions are further added to part of the semiconductor substrate so that a high concentration region to be a trigger (starting point) for separation is provided; and separation is performed using the separation layer as a cleavage plane. By the above steps of this embodiment mode, flatness on a large part of the separation plane of the single crystal semiconductor layer can be maintained, and separation can be performed easily. As a result, CMP or heat treatment at a high temperature can be omitted.

In addition, when the semiconductor substrate is cleaved using a separation layer formed by irradiation with a linear or rectangular ion beam, flatness of the surface of the single crystal semiconductor layer after separation can be improved. Accordingly, even if a substrate has a low upper temperature limit, such as a glass substrate, as a base substrate, an SOI substrate provided with a single crystal semiconductor layer which can be used for practical application can be obtained. Further, even in the case where the single crystal semiconductor layer is bonded to a large-sized glass substrate, the CMP can be omitted; thus, reduction in cost and improvement in throughput can be attained. Furthermore, since the separation plane of the semiconductor substrate 101 that has been separated has flatness, it is possible to reuse the semiconductor substrate 101 without performing CMP or heat treatment at a high temperature.

Although in accordance with this embodiment mode, the flat surface can be obtained without using CMP, the surface of the single crystal semiconductor layer 121 may be flattened by irradiation with a laser beam as needed. Irradiation with a laser beam is preferably performed in an inert atmosphere (such as a nitrogen atmosphere or a rare gas atmosphere) where the oxygen concentration is equal to or lower than 10 ppm. This is because laser beam irradiation in an oxygen atmosphere has a risk of making the surface of the single crystal semiconductor layer 121 rough.

Further, a plurality of semiconductor substrates 101 are arranged over a large-sized base substrate 110, so that the single crystal semiconductor layers 121 can be provided over the base substrate 110. In this case, a large-sized semiconductor device can be manufactured irrespective of the size of the semiconductor substrate 101.

The method for manufacturing an SOI substrate shown in this embodiment mode can be combined with a manufacturing method shown in another embodiment mode in this specification, as appropriate.

Embodiment Mode 2

This embodiment mode describes a method for manufacturing an SOI substrate, which is different from that in the above-described embodiment mode, with reference to drawings. Specifically, a case is described, where the {110} plane of crystal in a silicon wafer is used as a main surface of a semiconductor substrate that is used in the manufacture of an SOI substrate.

Figure 5A:
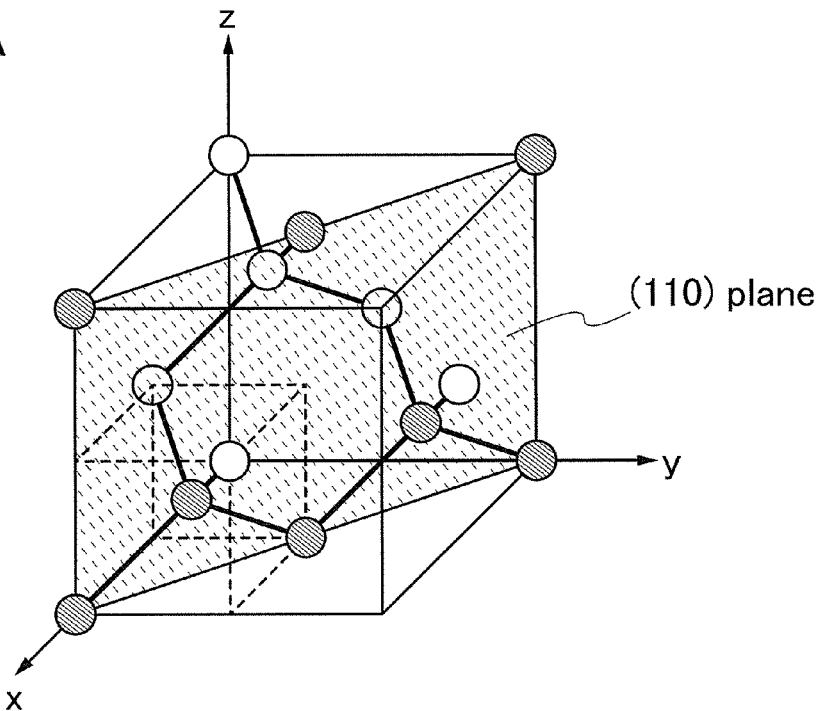
FIGS. 5A and 5B are diagrams each illustrating a crystal lattice of a semiconductor.
Figure 5B:
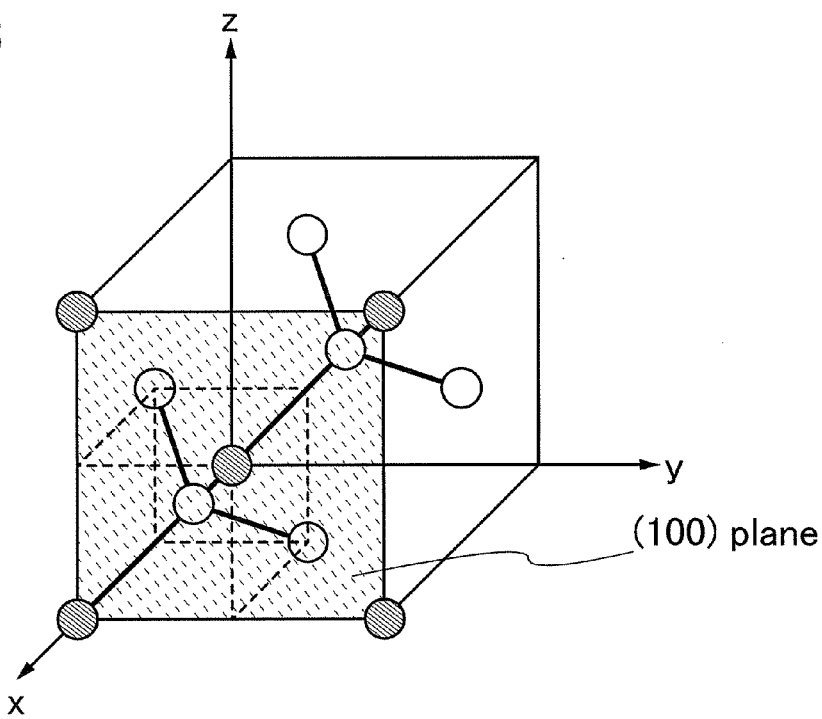

First, a crystal plane of a single crystal semiconductor will be described briefly. FIGS. 5A and 5B show a relation of a unit lattice of single crystal silicon, silicon atoms, and crystal planes. Here, FIG. 5A illustrates the (110) plane as a typical example of the {110} plane, and FIG. 5B illustrates the (100) plane as a typical example of the {100} plane. Note that in each of FIGS. 5A and 5B, silicon atoms which do not relate to the crystal plane are partly omitted for simplicity. Although silicon is used as an example of the semiconductor substrate, it should not be interpreted as being limited thereto.

As seen from FIGS. 5A and 5B, in the unit lattice of the single crystal silicon, a surface density of silicon atoms on the (110) plane is higher than that of silicon atoms of the (100) plane. Therefore, when an SOI substrate is manufactured using a single crystal silicon substrate in which the (110) plane of crystal is used as a main surface, bonds between atoms forming an insulating layer and the silicon atoms are formed closely, whereby adhesiveness between the insulating layer and the single crystal silicon layer is increased. In other words, separation of the single crystal silicon layer can be suppressed.

Since atoms are densely arranged on the (110) plane as described above, with use of the (110) plane as a main surface, flatness of the single crystal silicon layer in an SOI substrate which is to be manufactured can be improved as compared with the case of using another plane. In other words, a transistor manufactured using the single crystal silicon layer has excellent characteristics. In addition, there is an advantage that the (110) plane has higher Young's modulus than the (100) plane; thus, cleavage easily occurs with use of the (110) plane.

Next, a method for manufacturing an SOI substrate using a semiconductor substrate in which crystal planes are oriented along {110}, is described with reference to drawings. Note that, a case in which an insulating layer functioning as a bonding layer is provided on the base substrate side is described here.

Figure 10A:
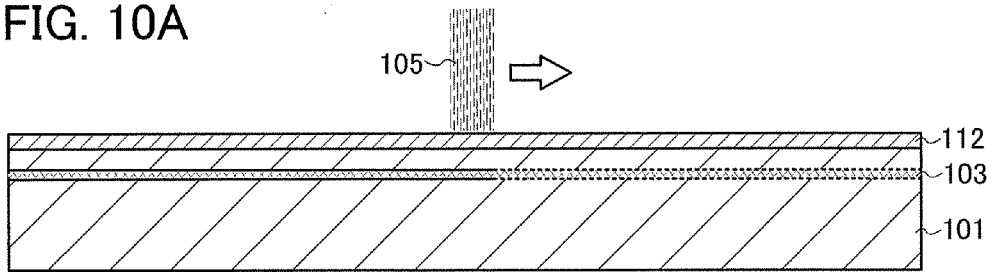
FIGS. 10A to 10D are diagrams illustrating an example of a manufacturing method of an SOI substrate of the present invention.

First, a semiconductor substrate 101 in which the {110} plane of crystal is used as a main surface is prepared. After an insulating layer 112 functioning as a protective layer is formed over the semiconductor substrate 101, first ions are added to a predetermined depth from a surface of the semiconductor substrate 101 by irradiation of the semiconductor substrate 101 with a linear or rectangular ion beam 105 through the insulating layer 112 so that a separation layer 103 is formed (see FIG. 10A). A detailed description of the semiconductor substrate 101 is omitted here because Embodiment Mode 1 can be referred to therefor.

The insulating layer 112 can be formed of one or more materials of silicon oxide, silicon nitride, silicon nitride oxide, silicon oxynitride, and the like. The insulating layer 112 may have a single-layer structure or a stacked structure. As a method for forming the insulating layer 112, a CVD method, a sputtering method, a thermal oxidation method, a thermal nitridation method, or the like is given; however, it is not particularly limited thereto. It is preferable that the thickness of the insulating layer 112 be about equal to or greater than 10 nm and equal to or less than 200 nm. Providing the insulating layer 112 can prevent a surface of the semiconductor substrate 101, which is to be a surface of a single crystal semiconductor layer later, from being rough caused by addition of first ions.

A detailed description of the method for forming the separation layer 103 is omitted here because Embodiment Mode 1 can be referred to therefor. After the separation layer 103 is formed, the insulating layer 112 may be removed, but the insulating layer 112 can function as a base insulating layer when it is left.

Figure 10B:
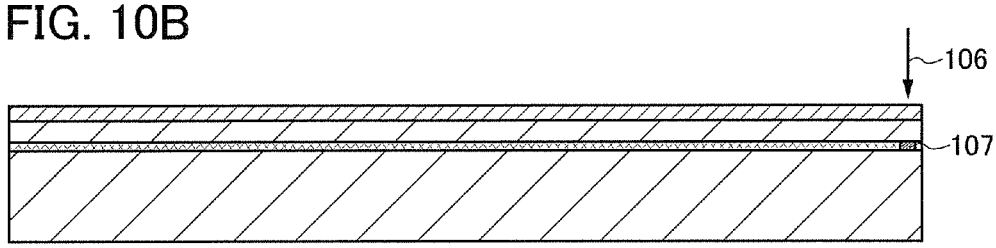

Next, second ions are added to part of the separation layer 103 formed in the semiconductor substrate 101, so that a high concentration region 107 is formed (see FIG. 10B). Note that the detailed method for forming the high concentration region 107 is omitted here because Embodiment Mode 1 can be referred to therefor.

Figure 10C:
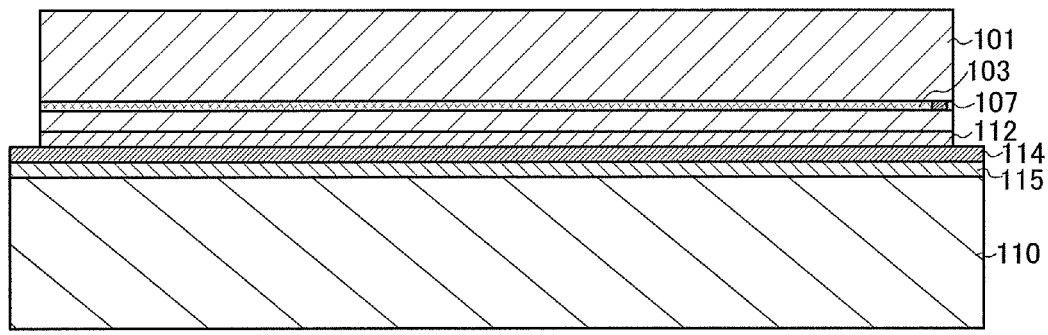

Next, the semiconductor substrate 101 is bonded to a base substrate 110 over which a nitrogen-containing layer 115 and an insulating layer 114 functioning as a bonding layer are stacked (see FIG. 10C).

The nitrogen-containing layer 115 functions as a barrier layer for preventing impurities such as movable ions, moisture, and the like contained in the base substrate from diffusing. The nitrogen-containing layer 115 is formed to have a single-layer structure or a stacked structure using a silicon nitride layer, a silicon nitride oxide layer, or a silicon oxynitride layer by a CVD method, a sputtering method, or the like. The nitrogen-containing layer 115 is preferably formed to have a thickness equal to or greater than 50 nm and equal to or less than 200 nm. For example, the nitrogen-containing layer 115 can be formed by stacking a silicon oxynitride layer and a silicon nitride oxide layer from the base substrate 110 side.

As for the insulating layer 114, a silicon oxide layer deposited by a CVD method using organosilane as a source gas can be used. Alternatively, a silicon oxide layer or a silicon oxynitride layer deposited by a CVD method using silane as a source gas can be used.

After the base substrate 110 and the semiconductor substrate 101 are bonded to each other with the insulating layer 114 interposed therebetween, it is preferable to perform either heat treatment or pressure treatment or the both. Heat treatment or pressure treatment makes it possible to increase the bonding strength between the base substrate 110 and the semiconductor substrate 101. The heat treatment is performed at a temperature which is equal to or lower than the upper temperature limit of the base substrate 110. The pressure treatment is performed so that pressure is applied in a direction perpendicular to the bonding surface, in consideration of the pressure resistance of the base substrate 110 and the semiconductor substrate 101.

Figure 10D:
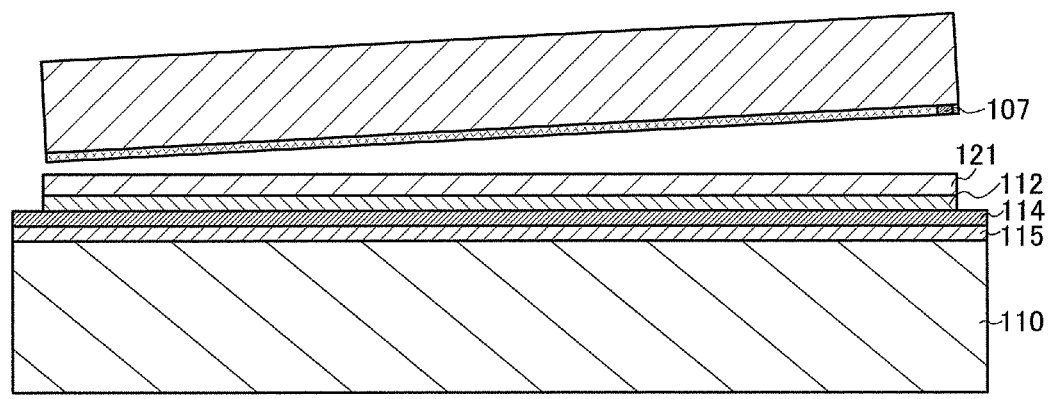

Next, heat treatment is performed, and part of the semiconductor substrate 101 is separated from the base substrate 110 using the separation layer 103 functioning as a cleavage plane (see FIG. 10D). The temperature of the heat treatment is preferably equal to or higher than a temperature at which the insulating layer 114 is formed and equal to or lower that the upper temperature limit of the base substrate 110. For example, heat treatment is performed at a temperature equal to or higher than 400° C. and equal to or lower than 600° C., whereby volume of microvoids formed in the separation layer 103 is changed, and thus cleavage occurs along the separation layer 103. Since the insulating layer 114 is bonded to the base substrate 110, a single crystal semiconductor layer 121 having the same crystallinity as the semiconductor substrate 101 is left over the base substrate 110.

In such a manner, an SOI substrate provided with the single crystal semiconductor layer 121 in which the {110} plane of crystal is used as a main surface can be provided. Surface density of atoms on the {110} plane is higher than that on another plane; therefore, adhesiveness between the insulating layer and the single crystal semiconductor layer is improved. In other words, separation of the single crystal semiconductor layer can be suppressed.

Further, since the atoms are densely arranged on the {110} plane as described above, with use of the {110} plane as a main surface, flatness of the single crystal semiconductor layer in the manufactured SOI substrate is improved as compared with the case of using another plane. Further, the separation layer is formed by adding a small amount of ions using a linear or rectangular ion beam, and the semiconductor substrate is cleaved using the separation layer as a cleavage plane, so that a surface of the single crystal semiconductor layer 121 which has been separated can be further flattened. As a result, even if CMP or heat treatment at a higher temperature is not performed, a transistor manufactured using the single crystal semiconductor layer 121 shown in this embodiment mode has excellent characteristics.

Note that the method for manufacturing an SOI substrate shown in this embodiment mode can be combined with a manufacturing method described in another embodiment mode, as appropriate.

Embodiment Mode 3

This embodiment mode describes a method for manufacturing an SOI substrate, which is different from that in the above-described embodiment mode, with reference to drawings.

Figure 11A:
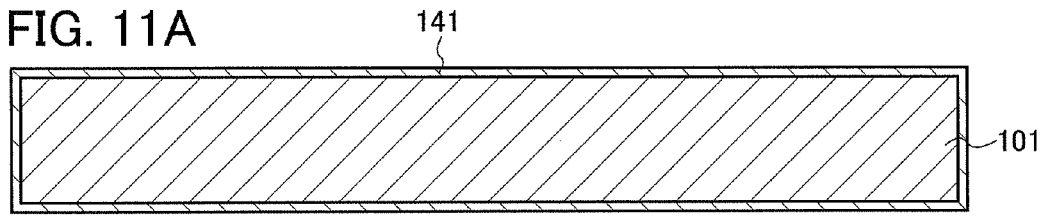
FIGS. 11A to 11E are diagrams illustrating an example of a manufacturing method of an SOI substrate of the present invention.

First, a semiconductor substrate 101 is washed with a sulfuric acid/hydrogen peroxide mixture (SPM), an ammonia peroxide mixture (APM), a hydrochloric acid/hydrogen peroxide mixture (HPM), diluted hydrogen fluoride (DHF), or the like, as appropriate. Then, the semiconductor substrate 101 is subjected to thermal oxidation to form an oxide film 141 (see FIG. 11A).

Thermal oxidation may be dry oxidation, and it is preferable to perform oxidation in the oxidative atmosphere to which halogen is added. HCl is a typical example of an additive material containing halogen, and instead of HCl, one or more of HF, $NF_3$, HBr, $Cl_2$, $ClF_3$, $BCl_3$, $F_2$, $Br_2$, and the like can be used. As an example of such thermal oxidation, it is preferable to perform thermal oxidation in an atmosphere containing HCl at equal to or greater than 0.5 vol. % and equal to or less than 10 vol. % (preferably 3 vol. %) with respect to oxygen, at a temperature which is equal to higher than 900° C. and equal to or lower than 1150° C. (typically, 1000° C.). The treatment time may be equal to or longer than 0.1 hours and equal to or shorter than 6 hours, preferably equal to or longer than 0.5 hours and equal to or shorter than 1 hour. The thickness of the oxide film to be formed is equal to or greater than 10 nm and equal to or less than 1000 nm (preferably, equal to or greater than 50 nm and equal to or less than 200 nm), and for example, the thickness is 100 nm.

When heat treatment is performed in such a temperature range, a gettering effect to the semiconductor substrate 101 can be obtained by the halogen element. As the gettering effect, an effect of removing a metal impurity is particularly obtained. That is, by action of chlorine, an impurity such as metal is turned into volatile chloride and then diffuses into the gas phase to be removed. In particular, the gettering is effective for the semiconductor substrate 101 whose surface is subjected to CMP treatment. In addition, hydrogen has an action of compensating defects in an interface between the semiconductor substrate 101 and the oxide film 141 so as to lower a local level density of the interface.

The oxide film 141 containing halogen has an effect of capturing a heavy metal that is an extrinsic impurity so as to prevent contamination of the single crystal semiconductor layer. Metals such as Fe, Cr, and Ni are typical heavy metals, and Mo may be further included therein in some cases. These are added into a single crystal semiconductor layer in a process of forming a separation layer through doping with ions without mass separation. In other words, the oxide film 141 that contains halogen by HCl oxidation or the like has an effect of gettering of an impurity such as a heavy metal which gives an adverse effect on the single crystal semiconductor layer. By heat treatment performed after the oxide film 141 is formed, the metal as an impurity contained in the single crystal semiconductor layer is separated out to the oxide film 141 and reacted with halogen (e.g., chlorine) to be captured.

Thus, the impurity captured in the oxide film 141 can be fixed, whereby contamination of the semiconductor substrate 101 can be prevented. That is, the oxide film 141 captures a metal element serving as a life time killer of a semiconductor so that the metal element does not diffuse again, whereby performance of a transistor can be improved.

The oxide film 141 formed by thermal oxidation contains halogen. Halogen is contained at a concentration which is equal to or higher than $1 \times 10^{17}/cm^3$ and equal to or lower than $5 \times 10^{20}/cm^3$, so that the oxide film 141 can have a function as a protective film which captures an impurity such as metal so as to prevent contamination of the semiconductor substrate 101.

Figure 11B:
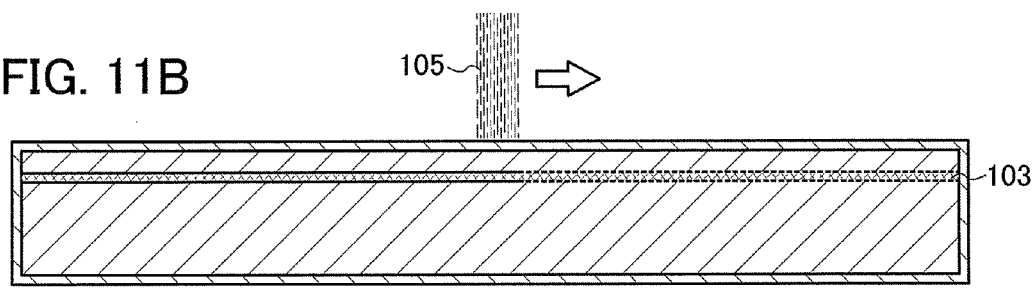

Next, first ions are added to a predetermined depth from a surface of the semiconductor substrate 101 by irradiation of the semiconductor substrate 101 with a linear or rectangular ion beam 105 through the oxide film 141 so that a separation layer 103 is formed (see FIG. 11B). A detailed description of the method for forming the separation layer 103 is omitted here because Embodiment Mode 1 can be referred to therefore.

Ions are added to the semiconductor substrate 101 without mass separation using an ion doping apparatus, whereby metal ions are added to the semiconductor substrate 101 concurrently with halogen ions or hydrogen ions. Since a metal ion has the large mass number, a large number of metal ions are distributed on a top surface side where the ions are added. In this embodiment mode, the oxide film 141 is formed on the surface of the semiconductor substrate 101. When the oxide film 141 is formed thicker than the depth at which the metal ions are added, the distribution of the metal can be kept within the oxide film 141. The oxide film 141 that contains halogen by HCl oxidation or the like has an effect of gettering of an impurity such as a heavy metal which gives an adverse effect on the semiconductor substrate 101. Thus, the impurity captured in the oxide film 141 can be fixed, so that contamination of the semiconductor substrate 101 can be prevented.

Figure 11C:
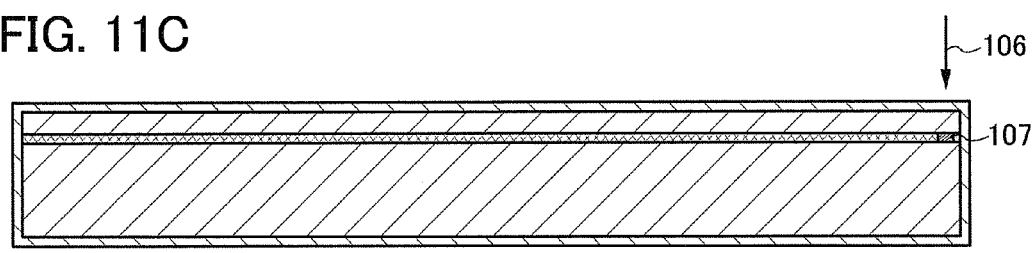

Next, second ions are added to part of the separation layer 103 formed in the semiconductor substrate 101, so that a high concentration region 107 is formed (see FIG. 11C). Note that a detailed description of the method for forming the high concentration region 107 is omitted here because Embodiment Mode 1 can be referred to therefore.

Figure 11D:
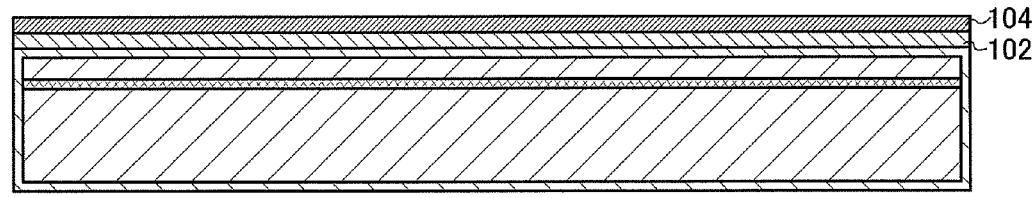

Next, a nitrogen-containing layer 102 is formed over the oxide film 141, and an insulating layer 104 functioning as a bonding layer is formed over the nitrogen-containing layer 102 (see FIG. 11D). The nitrogen-containing layer 102 and the insulating layer 104 may be formed using the manufacturing method and the material described in Embodiment Mode 1.

Figure 11E:
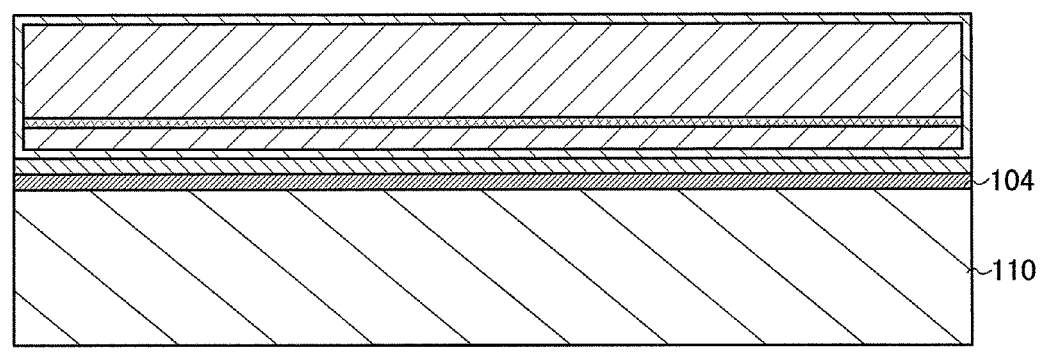

Then, the semiconductor substrate 101 and a base substrate 110 are bonded to each other (see FIG. 11E). A surface of the insulating layer 104 formed over the semiconductor substrate 101 is disposed in contact with a surface of the base substrate 110, thereby forming a bond. This bond is formed under the action of a van der Waals force, and by disposing the base substrate 110 and the semiconductor substrate 101 to be contacted with each other, a strong bond can be formed by hydrogen bonding.

After that, heat treatment is performed, and part of the semiconductor substrate 101 is separated from the base substrate 110 using the separation layer 103 as a cleavage plane, and as a result, an SOI substrate can be manufactured.

Note that the method for manufacturing an SOI substrate shown in this embodiment mode can be combined with a manufacturing method described in another embodiment mode, as appropriate.

Embodiment Mode 4

This embodiment mode describes an example of a method for manufacturing a semiconductor device using the SOI substrate shown in the above embodiment mode, with reference to FIGS. 6A to 6D, FIGS. 7A to 7C, FIGS. 8A to 8C, and FIGS. 9A and 9B. Note that a liquid crystal display device is given as an example of a semiconductor device in this embodiment mode; however, a semiconductor device of the present invention is not limited to a liquid crystal display device.

First, a single crystal semiconductor layer is formed over a base substrate by the method shown in Embodiment Mode 1 or the like (see FIG. 6A). Here, the description is made using a structure in which a nitrogen-containing layer 1002 functioning as a barrier layer, an insulating layer 1004 functioning as a bonding layer, and a single crystal semiconductor layer 1006 are stacked in this order over the base substrate 1000; however, it is not limited thereto.

Next, the single crystal semiconductor layer 1006 and the insulating layer 1004 are patterned into a desired shape to form island-shaped single crystal semiconductor layers. The island-shaped single crystal semiconductor layers are formed using a single crystal semiconductor layer in a region where the second ions are not added in the above embodiment mode.

As to an etching process in the patterning, either plasma etching (dry etching) or wet etching may be employed. In a case of processing a large-sized substrate, plasma etching is suitable. As an etching gas, a fluorine-based gas such as a $CF_4$ gas or a $NF_3$ gas or a chlorine-based gas such as a $Cl_2$ gas or a $BCl_3$ gas is used. An inert gas such as He or Ar may be added to the etching gas appropriately. Alternatively, localized electric discharge is possible when the etching process by atmospheric pressure discharge is employed, and thus etching can be performed without forming a mask layer over an entire substrate.

After patterning the single crystal semiconductor layer 1006 and the insulating layer 1004, a p-type impurity such as boron, aluminum, or gallium is preferably added thereto in order to control the threshold voltage. For example, as the p-type impurity, boron can be added at a concentration equal to or higher than $5 \times 10^{16}$ cm$^{-3}$ and equal to or lower than $1 \times 10^{18}$ cm$^{-3}$.

Over the base substrate 1000, a silicon nitride film and a silicon oxide film are stacked to form the nitrogen-containing layer 1002. Providing the nitrogen-containing layer 1002 can prevent contamination of the single crystal semiconductor layer 1006 due to movable ions. Note that instead of the silicon nitride film, a silicon nitride oxide film, an aluminum nitride film, or an aluminum nitride oxide film may be used.

Then, a gate insulating layer 1008 covering the island-shaped single crystal semiconductor layers is formed (see FIG. 6B). Note that for convenience, the island-shaped single crystal semiconductor layers which are formed by patterning are referred to as single-crystal semiconductor layers 1010, 1012, and 1014. The gate insulating layer 1008 is formed of an insulating film containing silicon with a thickness equal to or greater than 10 nm and equal to or less than 150 nm by a plasma CVD method, a sputtering method, or the like. Specifically, the gate insulating layer 1008 may be formed by using a material such as an oxide material or nitride material of silicon, typified by silicon nitride, silicon oxide, silicon oxynitride, and silicon nitride oxide. Note that the gate insulating layer 1008 may have a single-layer structure or a stacked structure.

Further, a thin silicon oxide film may be formed between the single crystal semiconductor layers and the gate insulating layer, which has a thickness equal to or greater than 1 nm and equal to or less than 100 nm, preferably equal to or greater than 1 nm and equal to or less than 10 nm, or more preferably equal to or greater than 2 nm and equal to or less than 5 nm. In order to form a gate insulating layer having less gate leakage current at a low temperature, a rare gas element such as argon may be contained in a reaction gas.

Next, a first conductive film and a second conductive film, which serve as a gate electrode layer, are stacked over the gate insulating layer 1008. The first conductive film may be formed with a thickness about equal to or greater than 20 nm and equal to or less than 100 nm, and the second conductive film may be formed with a thickness about equal to or greater than 100 nm and equal to or less than 400 nm. The first conductive film and the second conductive film can be formed by a method such as a sputtering method, an evaporation method, a CVD method, or the like.

The first conductive film and the second conductive film may be formed of an element selected from tantalum (Ta), tungsten (W), titanium (Ti), molybdenum (Mo), aluminum (Al), copper (Cu), chromium (Cr), neodymium (Nd), or the like; or an alloy material or a compound material containing any of aforementioned element as its main component, or the like. Further, for the first and second conductive films, a semiconductor film typified by a polycrystal silicon film doped with an impurity element such as phosphorus, an AgPdCu alloy, or the like may be used. Note that the two-layer structure is described in this embodiment mode; however, the present invention is not limited thereto. A stacked-layer structure of three or more layers or a single layer structure may be used.

Then, using a photolithography method, masks 1016a, 1016b, 1016c, 1016d, and 1016e each formed of a resist material are formed. The first conductive film and the second conductive film are processed into a desired shape using the above masks, thereby forming a first gate electrode layer 1018a, a first gate electrode layer 1018b, a first gate electrode layer 1018c, a first gate electrode layer 1018d, a first conductive layer 1018e, a conductive layer 1020a, a conductive layer 1020b, a conductive layer 1020c, a conductive layer 1020d, and a conductive layer 1020e (see FIG. 6C).

Here, etching can be performed to form a desired tapered shape by an ICP (Inductively Coupled Plasma) etching method with appropriate control of the etching conditions (e.g., the amount of electric power applied to a coiled electrode layer, the amount of electric power applied to an electrode layer on the substrate side, the electrode temperature on the substrate side, and the like). An angle and the like of the tapered shape may also be controlled depending on the shape of the masks. As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used. In this embodiment mode, the second conductive film is etched using an etching gas containing $CF_4$, $Cl_2$, or $O_2$, and the first conductive film is successively etched using an etching gas containing $CF_4$ or $Cl_2$.

Next, the conductive layer 1020a, the conductive layer 1020b, the conductive layer 1020c, the conductive layer 1020d, and the conductive layer 1020e are processed into desired shapes using the mask 1016a, the mask 1016b, the mask 1016c, the mask 1016d, and the mask 1016e. At this time, etching is conducted under an etching condition of a high selection ratio of the second conductive films which form the conductive layers with respect to the first conductive films which form the first gate electrode layers and the first conductive layer. By this etching, a second gate electrode layer 1022a, a second gate electrode layer 1022b, a second gate electrode layer 1022c, a second gate electrode layer 1022d, and a second conductive layer 1022e are formed.

In this embodiment mode, the second gate electrode layers and the second conductive layer also have tapered shapes, and the taper angles of the second gate electrode layers 1022a to 1022d and the second conductive layer 1022e are larger than the taper angles of the first gate electrode layers 1018a to 1018e and the first conductive layer 1018e. Note that "taper angle" refers to an angle formed by the meeting of a base with a side of an object. Thus, when the taper angle is 90°, the conductive layer has a perpendicular side with respect to the base of the conductive layer. By setting the taper angle to be smaller than 90°, coverage of the conductive layers with a film to be stacked thereover is improved and defects can be reduced. In this embodiment mode, $Cl_2$, $SF_6$, or $O_2$ is used as an etching gas for forming the second gate electrode layers and the second conductive layer.

Through the aforementioned steps, a gate electrode layer 1024a and a gate electrode layer 1024b can be formed in a peripheral driver circuit region 1080, and a gate electrode layer 1024c, a gate electrode layer 1024d, and a conductive layer 1024e can be formed in a pixel region 1082 (see FIG. 6D). Note that the masks 1016a, 1016b, 1016c, 1016d, and 1016e are removed after the above-described step.

Next, with use of the gate electrode layer 1024a, the gate electrode layer 1024b, the gate electrode layer 1024c, and the gate electrode layer 1024d as masks, an impurity element imparting n-type conductivity is added to form a first n-type impurity region 1026a, a first n-type impurity region 1026b, a first n-type impurity region 1028a, a first n-type impurity region 1028b, a first n-type impurity region 1030a, a first n-type impurity region 1030b, and a first n-type impurity region 1030c (see FIG. 7A).

In this embodiment mode, doping is performed using phosphine ($PH_3$) as a doping gas containing an impurity element. Here, phosphorus (P) that is an impurity element imparting n-type conductivity is added to the first n-type impurity regions at a concentration about equal to or higher than $1\times10^{16}/cm^3$ and equal to or lower than $5\times10^{19}/cm^3$.

Then, a mask 1032a covering the single crystal semiconductor layer 1010 and masks 1032b and 1032c covering part of the single crystal semiconductor layer 1014 are formed. With use of the mask 1032a, the mask 1032b, the mask 1032c, and the second gate electrode layer 1022b as masks, an impurity element imparting n-type conductivity is added. As a result, a second n-type impurity region 1034a, a second n-type impurity region 1034b, a third n-type impurity region 1036a, a third n-type impurity region 1036b, a second n-type impurity region 1040a, a second n-type impurity region 1040b, a second n-type impurity region 1040c, a third n-type impurity region 1042a, a third n-type impurity region 1042b, a third n-type impurity region 1042c, and a third n-type impurity region 1042d are formed.

In this embodiment mode, doping is performed using phosphine ($PH_3$) as a doping gas containing an impurity element. Here, phosphorus (P) that is an impurity element imparting n-type conductivity is added to the second n-type impurity regions at a concentration about equal to or higher than $1\times10^{17}/cm^3$ and equal to or lower than $1\times10^{21}/cm^3$. The third n-type impurity regions 1036a and 1036b are doped with an impurity element imparting n-type conductivity at the same concentration as or at a slightly higher concentration than that added to the third n-type impurity regions 1042a, 1042b, 1042c, and 1042d. Furthermore, a channel formation region 1038, a channel formation region 1044a, and a channel formation region 1044b are formed (see FIG. 7B).

The second n-type impurity regions are high-concentration impurity regions and each function as a source region or a drain region. On the other hand, the third n-type impurity regions are low-concentration impurity regions and each function as a so-called LDD (Lightly Doped Drain) region. The third n-type impurity regions 1036a and 1036b are formed so as to be overlapped with the first gate electrode layer 1018b. Accordingly, an electric field around a source or a drain can be relieved and deterioration of on current due to hot carriers can be prevented. On the other hand, each of the third n-type impurity regions 1042a, 1042b, 1042c, and 1042d is not overlapped with the gate electrode layer 1024c or 1024d; thus, an effect of reducing off current can be obtained.

Next, the masks 1032a, 1032b, and 1032c are removed, and a mask 1046a covering the single crystal semiconductor layer 1012 and a mask 1046b covering the single crystal semiconductor layer 1014 are formed. With use of the mask 1046a, the mask 1046b, and the gate electrode layer 1024a as masks, an impurity element imparting p-type conductivity is added. Accordingly, a first p-type impurity region 1048a and a first p-type impurity region 1048b, and a second p-type impurity region 1050a and a second p-type impurity region 1050b are formed.

In this embodiment mode, doping is performed using diborane ($B_2H_6$) as a doping gas containing an impurity element. Here, boron (B) which is an impurity element imparting p-type conductivity is added to the first p-type impurity regions and the second p-type impurity regions at a concentration about equal to or higher than $1\times10^{18}/cm^3$ and equal to or lower than $5\times10^{21}/cm^3$. Further, a channel formation region 1052 is formed (see FIG. 7C).

The first p-type impurity regions are high-concentration impurity regions and each function as a source region or a drain region. On the other hand, the second p-type impurity regions are low-concentration impurity regions and each function as a so-called LDD (Lightly Doped Drain) region.

After that, the masks 1046a and 1046b are removed. After the masks are removed, an insulating film may be formed to cover the side surfaces of the gate electrode layers. The insulating film can be formed by a plasma CVD method or a low-pressure CVD (LPCVD) method. Heat treatment, intense light irradiation, laser light irradiation, or the like may be performed to activate the impurity elements.

Next, an interlayer insulating layer which covers the gate electrode layers and the gate insulating layer is formed. In this embodiment mode, the interlayer insulating layer has a stacked structure of an insulating film 1054 and an insulating film 1056 (see FIG. 8A). A silicon nitride oxide film is formed as the insulating film 1054 with a thickness of 100 nm, and a silicon oxynitride film is formed as the insulating film 1056 with a thickness of 900 nm. Although the interlayer insulating layer has a two-layer stacked structure in this embodiment mode, it may have a single-layer structure or a stacked structure including three or more layers. In this embodiment mode, the insulating film 1054 and the insulating film 1056 are successively formed by a plasma CVD method without being exposed to the atmospheric air. Note that the insulating films 1054 and 1056 are not limited to the above-described material.

Alternatively, the insulating films 1054 and 1056 can be formed using a material selected from silicon oxide, silicon nitride, aluminum oxide, aluminum nitride, aluminum oxynitride, aluminum nitride oxide having a higher content of nitrogen than that of oxygen, diamond-like carbon (DLC), a carbon film containing nitrogen, or another substance including an inorganic insulating material. Alternatively, a siloxane resin may also be used. A siloxane resin is a resin containing a Si—O—Si bond. Siloxane has a skeleton structure formed by a bond of silicon (Si) and oxygen (O). As a substituent, an organic group (for example, an alkyl group or an aryl group) containing at least hydrogen is used. A fluoro group may be included in the organic group. Alternatively, an organic insulating material such as polyimide, acrylic, polyamide, polyimide amide, benzocyclobutene, or polysilazane can be used.

Next, contact holes (openings) that reach the single crystal semiconductor layers and the gate electrode layers are formed in the insulating films 1054 and 1056 and the gate insulating layer 1008, using a resist mask. Etching may be performed once or plural times depending on a selection ratio for etching of a material to be used. In this embodiment mode, first etching is performed under a condition of a high selection ratio of the insulating film 1056 that is a silicon oxynitride film with respect to the insulating film 1054 that is a silicon nitride oxide film and the gate insulating layer 1008, so that parts of the insulating film 1056 is removed. Next, parts of the insulating film 1054 and the gate insulating layer 1008 are removed by second etching, and openings which each reach a source or a drain are formed.

Then, a conductive film is formed to cover the openings, and the conductive film is etched. As a result, a source or a drain electrode layer 1058a, a source or a drain electrode layer 1058b, a source or a drain electrode layer 1060a, a source or a drain electrode layer 1060b, a source or a drain electrode layer 1062a, and a source or a drain electrode layer 1062b, each of which is electrically connected to part of a source region or a drain region, are formed. For each source or drain electrode layer, one or more elements of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), arsenic (As), boron (B), phosphorus (P), gallium (Ga), indium (In), tin (Sn), and the like; a compound or alloy material that contains any of the aforementioned elements as its main component (e.g., indium tin oxide (ITO), indium zinc oxide (IZO), indium tin oxide that contains silicon oxide (ITSO), zinc oxide (ZnO), aluminum-neodymium (Al—Nd), magnesium-silver (Mg—Ag), or the like); a substance that is a combination of any of these compounds; or the like can be used. Alternatively, a silicide (e.g., aluminum-silicon, molybdenum-silicon, or nickel silicide), a nitrogen-containing compound (e.g., titanium nitride, tantalum nitride, or molybdenum nitride), silicon (Si) that is doped with an impurity element such as phosphorus (P), or the like can be used.

Through the above steps, a p-channel thin film transistor 1064 and an n-channel thin film transistor 1066 are formed in the peripheral driver circuit region 1080, and an n-channel thin film transistor 1068 and a capacitor wiring 1070 are formed in the pixel region 1082, respectively (see FIG. 8B).

Next, an insulating film 1072 is formed as a second interlayer insulating layer. The insulating film 1072 can be formed of a material selected from silicon oxide, silicon nitride, silicon oxynitride, silicon nitride oxide, aluminum oxide, aluminum nitride (AlN), aluminum oxynitride (AlON), aluminum nitride oxide having a higher content of nitrogen than that of oxygen, diamond-like carbon (DLC), a nitrogen-containing carbon film, phosphosilicate glass (PSG), borophosphosilicate glass (BPSG), an alumina film, polysilazane, or another substance containing an inorganic insulating material. Alternatively, a siloxane resin may also be used. Alternatively, an organic insulating material such as polyimide, acrylic, polyamide, polyimide amide, or benzocyclobutene can be used.

Next, a contact hole is formed in the insulating film 1072 in the pixel region 1082, and a pixel electrode layer 1074 is formed (see FIG. 8C). The pixel electrode layer 1074 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), or an alloy or a metal nitride thereof.

A conductive composition including a conductive high molecule (also referred to as a conductive polymer) can also be used as the pixel electrode layer 1074. A thin film of a conductive composition preferably has a sheet resistance which is equal to or lower than 10000 Ω/square. When a thin film of a conductive composition is formed as a pixel electrode layer having a light-transmitting property, light transmittance is preferably equal to or greater than 70% at a wavelength of 550 nm. Further, it is preferable that a conductive high molecule included in a conductive composition have resistance which is equal to or lower than 0.1 Ω·cm.

As the conductive high molecule, a so-called π electron conjugated conductive high molecule can be used. For example, polyaniline and a derivative thereof, polypyrrole and a derivative thereof, polythiophene and a derivative thereof, a copolymer of those materials, or the like can be given.

As for an organic resin, as long as a resin is compatible to a conductive high molecule or a resin can be mixed and dispersed into a conductive high molecule, a thermosetting resin, a thermoplastic resin, or a photocurable resin may be used. Specific examples of the organic resin are given below: a polyester-based resin such as polyethylene terephthalate, polybutylene terephthalate, or polyethylene naphthalate; a polyimide-based resin such as polyimide or polyamide imide; a polyamide resin such as polyamide 6, polyamide 6,6, polyamide 12, or polyamide 11; a fluorine resin such as poly (vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin; a melamine resin; a phenol-based resin; polyether; an acrylic-based resin, or a copolymer of any of those resins.

Furthermore, by doping a conductive composition with acceptor type dopant or donor type dopant, an oxidation-reduction potential of a conjugated electron of a conjugated conductive high molecule is varied; therefore, electrical conductivity may be adjusted.

As the acceptor type dopant, a halogen compound, a Lewis acid, a protonic acid, an organic cyano compound, an organic metal compound, or the like can be used. Examples of a halogen compound include chlorine, bromine, iodine, iodine chloride, iodine bromide, iodine fluoride, and the like. As examples of a Lewis acid, phosphorus pentafluoride, arsenic pentafluoride, antimony pentafluoride, boron trifluoride, boron trichloride, boron tribromide, and the like can be given. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As the organic carboxylic acid and the organic sulfonic acid, the above-described carboxylic acid compounds or sulfonic acid compounds can be used. As the organic cyano compound, a compound in which two or more cyano groups are included in a conjugated bond can be used. For example, tetracyanoethylene, tetracyanoethylene oxide, tetracyanobenzene, tetracyanoquinodimethane, tetracyanoazanaphthalene, and the like can be given.

As the donor type dopant, alkali metal, alkaline-earth metal, a quaternary amine compound, or the like can be used.

The aforementioned conductive composition is dissolved in water or an organic solvent (such as an alcohol-based solvent, a ketone-based solvent, an ester-based solvent, a hydrocarbon-based solvent, or an aromatic-based solvent), so that a thin film which serves as the pixel electrode layer 1074 can be formed by an application method, a coating method, a droplet discharge method (also referred to as an ink-jet method), a printing method, or the like.

Figure 9A:
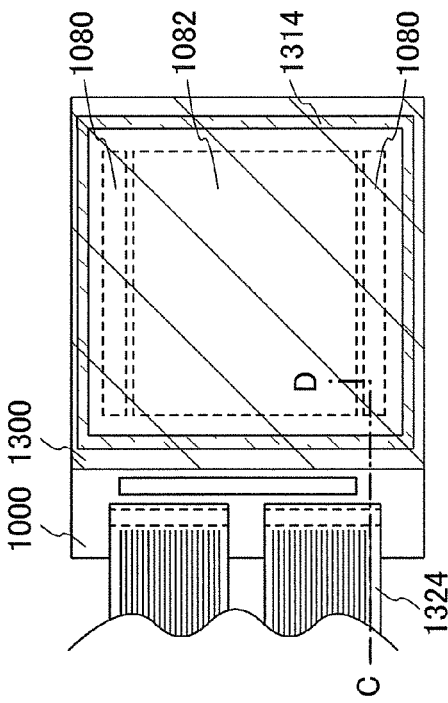
FIG. 9A is a top view illustrating an example of a manufacturing method of a semiconductor device using an SOI substrate of the present invention.
Figure 9B:
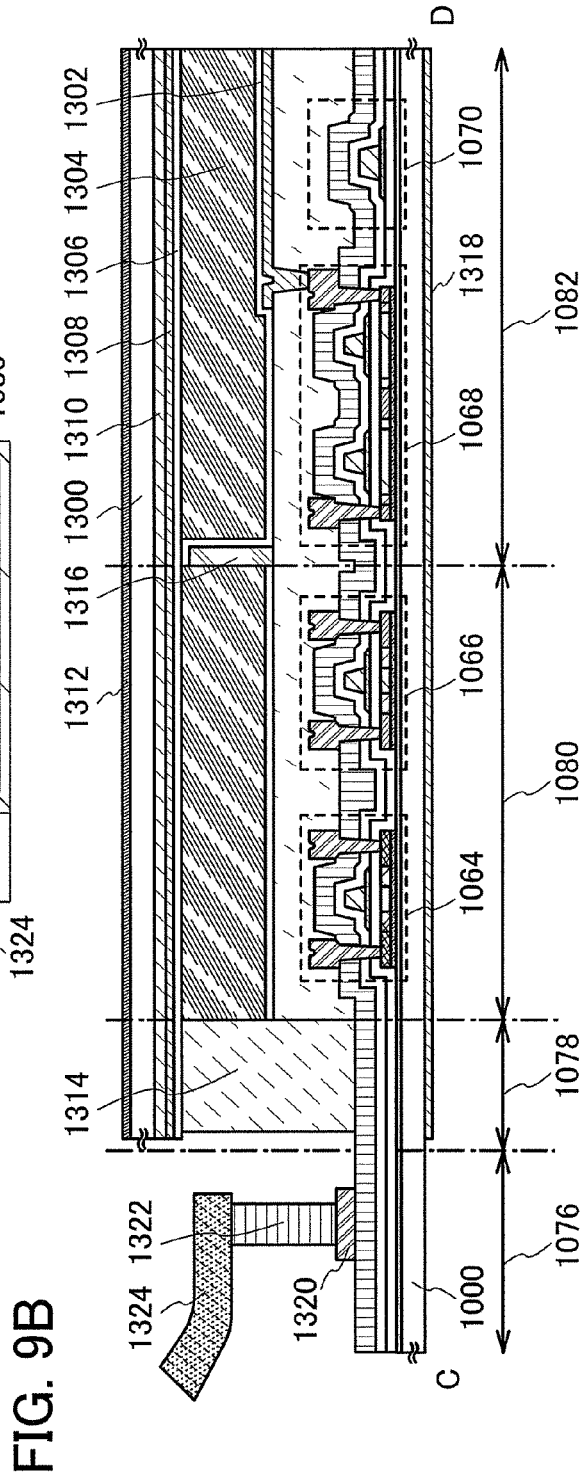
FIG. 9B is a cross-sectional view thereof.

Next, an insulating layer 1302 referred to as an alignment film is formed to cover the pixel electrode layer 1074 and the insulating film 1072 (see FIG. 9B). The insulating layer 1302 can be formed by a screen printing method or an offset printing method. FIGS. 9A and 9B are a plane view and a cross-sectional view of a semiconductor device, where FIG. 9A is a plane view of the semiconductor device, and FIG. 9B is a cross-sectional view taken along a line C-D of FIG. 9A. The semiconductor device includes an external terminal connection region 1076, a sealing region 1078, the peripheral driver circuit region 1080, and the pixel region 1082.

After formation of the insulating layer 1302, rubbing treatment is performed. An insulating layer 1306 which functions as an alignment film can be formed in a similar manner to the insulating layer 1302.

After that, a counter substrate 1300 and the base substrate 1000 having an insulating surface are attached to each other, with a sealant 1314 and a spacer 1316 interposed therebetween, and the space is provided with a liquid crystal layer 1304. The counter substrate 1300 is provided with the insulating layer 1306 functioning as an alignment film, a conductive layer 1308 functioning as a counter electrode, a colored layer 1310 functioning as a color filter, a polarizer 1312 (also referred to as a polarizing plate), and the like. Note that the base substrate 1000 having an insulating surface is provided with a polarizer 1318 (polarizing plate); however, the present invention is not limited thereto. For example, in the case of a reflective liquid crystal display device, a polarizer may be provided for either a counter substrate or a base substrate.

Then, an FPC 1324 is connected to a terminal electrode layer 1320 which is electrically connected to the pixel region, through an anisotropic conductive layer 1322. The FPC 1324 has a function of transmitting signals from the external. The liquid crystal display device can be manufactured by the above-described process.

Although the method for manufacturing a liquid crystal display device is described in this embodiment mode, the present invention is not limited thereto. In addition, a transistor included in a peripheral circuit, a pixel, or the like in a light-emitting device provided with a light-emitting element can be formed with use of the SOI substrate described in the above embodiment mode.

This embodiment mode can be implemented by combination with the SOI substrate described in the above embodiment mode as appropriate.

Embodiment Mode 5

This embodiment mode exemplifies electronic devices manufactured using the SOI substrate shown in the above embodiment mode, with reference to FIGS. 12A to 12H.

As electronic devices manufactured using the SOI substrate shown in the above embodiment mode, the following can be given: cameras such as video cameras and digital cameras, goggle type displays (head mounted displays), navigation systems, audio reproducing devices (car audio set, audio component set, or the like), computers, game machines, portable information terminals (mobile computer, mobile phone, portable game machine, e-book reader, or the like), and image reproducing devices provided with a recording medium (specifically, a device provided with a display that can reproduce a recording medium such as a digital versatile disc (DVD) and display the image), and the like.

Figure 12A:
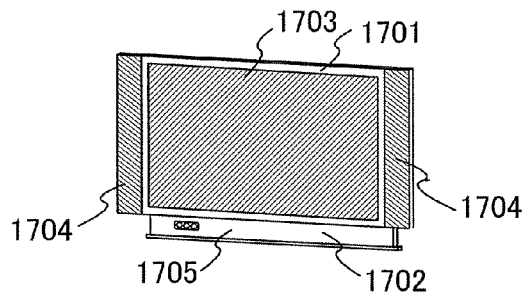
FIGS. 12A to 12H are diagrams each illustrating an electronic device using an SOI substrate of the present invention.

FIG. 12A shows a television set or a monitor of a personal computer, which includes a chassis 1701, a support 1702, a display portion 1703, speaker portions 1704, a video input terminal 1705, and the like. The display portion 1703 includes the SOI substrate shown in the above embodiment mode. With use of the SOI substrate shown in the above embodiment mode, a television set or a monitor of a personal computer having high reliability and high performance can be provided.

Figure 12B:
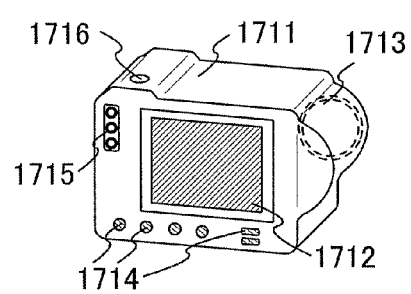

FIG. 12B shows a digital camera. An image receiving portion 1713 is provided in the front side of a main body 1711, and a shutter button 1716 is provided at the upper portion of the main body 1711. A display portion 1712, operation keys 1714, and an external connection port 1715 are provided at the backside of the main body 1711. The display portion 1712 includes the SOI substrate shown in the above embodiment mode. With use of the SOI substrate shown in the above embodiment mode, a high-reliable and high-performance digital camera can be provided.

Figure 12C:
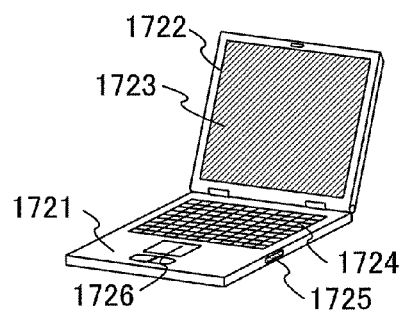

FIG. 12C shows a personal computer. A main body 1721 is provided with a keyboard 1724, an external connection port 1725, and a pointing device 1726. Moreover, the main body 1721 has a chassis 1722 having a display portion 1723 attached thereto. The display portion 1723 includes the SOI substrate shown in the above embodiment mode. With use of the SOI substrate shown in the above embodiment mode, a high-reliable and high-performance personal computer can be provided.

Figure 12D:
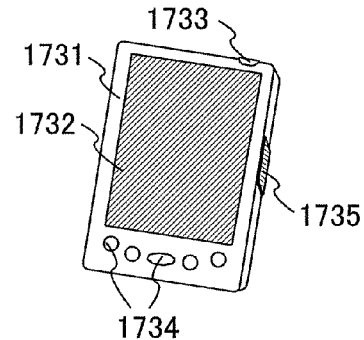

FIG. 12D shows a mobile computer, which includes a main body 1731, a display portion 1732, a switch 1733, operating keys 1734, an infrared port 1735 and the like. The display portion 1732 is provided with an active matrix display device. The display portion 1732 includes the SOI substrate shown in the above embodiment mode. With use of the SOI substrate shown in the above embodiment mode, a high-reliable and high-performance mobile computer can be provided.

Figure 12E:
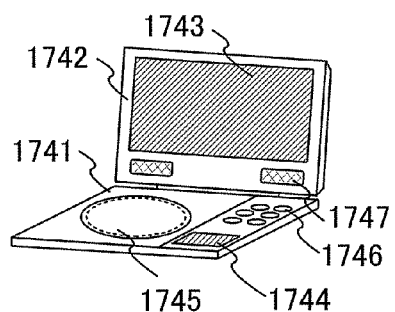

FIG. 12E shows an image reproduction device. A main body 1741 is provided with a display portion B 1744, a recording medium reading portion 1745, and an operation key 1746. Furthermore, a chassis 1742 that has speaker portions 1747 and a display portion A 1743 is attached to the main body 1741. The display portion A 1743 and the display portion B 1744 each include the SOI substrate shown in the above embodiment mode. With use of the SOI substrate shown in the above embodiment mode, a high-reliable and high-performance image reproduction device can be provided.

Figure 12F:
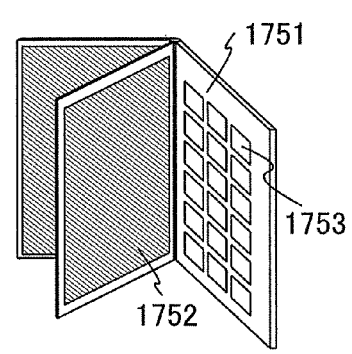

FIG. 12F shows an electronic book. A main body 1751 is provided with an operation key 1753. A plurality of display portions 1752 are attached to the main body 1751. Each display portion 1752 includes the SOI substrate shown in the above embodiment mode. With use of the SOI substrate shown in the above embodiment mode, a high-reliable and high-performance electronic book can be provided.

Figure 12G:
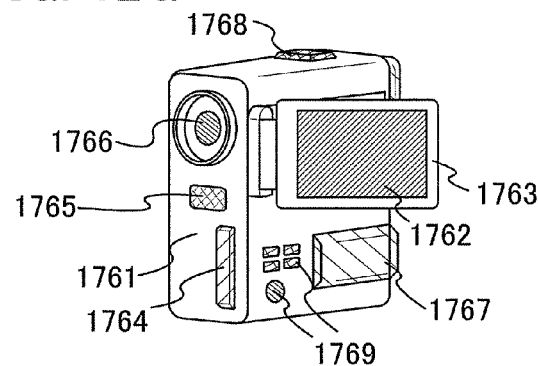

FIG. 12G shows a video camera. A main body 1761 is provided with an external connection port 1764, a remote control receiving portion 1765, an image receiving portion 1766, a battery 1767, an audio input portion 1768, and operation keys 1769. A chassis 1763 including a display portion 1762 is attached to the main body 1761. The display portion 1762 includes the SOI substrate shown in the above embodiment mode. With use of the SOI substrate shown in the above embodiment mode, a high-reliable and high-performance video camera can be provided.

Figure 12H:
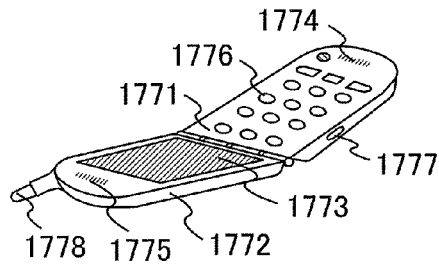

FIG. 12H shows a mobile phone, which includes a main body 1771, a chassis 1772, a display portion 1773, an audio input portion 1774, an audio output portion 1775, operating keys 1776, an external connection port 1777, an antenna 1778, and the like. The display portion 1773 includes the SOI substrate shown in the above embodiment mode. With use of the SOI substrate shown in the above embodiment mode, a high-reliable and high-performance mobile phone can be provided.

As described above, the application range of the present invention is so wide that the present invention can be applied to electronic devices of all fields.

This application is based on Japanese Patent Application serial no. 2007-245603 filed with Japan Patent Office on Sep. 21, 2007, the entire contents of which are hereby incorporated by reference.

What is claimed is:

1. A method for manufacturing an SOI substrate comprising the steps of:
   forming an oxide film over an entire surface of a single crystal semiconductor substrate by performing heat treatment;
   adding a first ion to the single crystal semiconductor substrate by irradiation of the single crystal semiconductor substrate with a planar, linear, or rectangular ion beam without mass separation through the oxide film, so that a separation layer is formed;
   adding a second ion subjected to mass separation to parts of the separation layer formed in the single crystal semiconductor substrate by scanning with a spot ion beam, so that at least two high concentration regions each having a linear shape are formed in parallel to each other;
   disposing one surface of the single crystal semiconductor substrate and a surface of a base substrate to face each other in order to bond a surface of an insulating layer formed over the single crystal semiconductor substrate and the surface of the base substrate; and
   cleaving the single crystal semiconductor substrate using the separation layer as a cleavage plane, so that a single crystal semiconductor layer is formed over the base substrate,
   wherein a mass number of the second ion is the same as or larger than a mass number of the first ion.

2. The method for manufacturing an SOI substrate according to claim 1, wherein the first ion is added by an ion doping method, and the second ion is added by an ion implantation method.

3. The method for manufacturing an SOI substrate according to claim 1, wherein the parts of the separation layer where the second ion is selectively added include an edge of the single crystal semiconductor substrate or a vicinity of an edge of the single crystal semiconductor substrate.

4. The method for manufacturing an SOI substrate according to claim 1, wherein $H^+$, $H_2^+$, and $H_3^+$ are used as the first ion.

5. The method for manufacturing an SOI substrate according to claim 1, wherein $H_3^+$ or $He^+$ obtained by mass separation is used as the second ion.

6. The method for manufacturing an SOI substrate according to claim 1, wherein after the single crystal semiconductor layer is formed over the base substrate, a surface of the single crystal semiconductor layer is irradiated with laser light in an inert atmosphere.

7. The method for manufacturing an SOI substrate according to claim 1, wherein the one surface of the single crystal semiconductor substrate is a {110} plane.

8. The method for manufacturing an SOI substrate according to claim 1, wherein a glass substrate is used as the base substrate.

9. The method for manufacturing an SOI substrate according to claim 1, wherein a silicon oxide film formed using an organosilane gas by a chemical vapor deposition method is used for the insulating layer.

10. A method for manufacturing an SOI substrate comprising the steps of:
forming an oxide film over an entire surface of a single crystal semiconductor substrate by performing heat treatment in an oxidative atmosphere containing halogen;
adding a first ion to the single crystal semiconductor substrate by irradiation of the single crystal semiconductor substrate with a planar, linear, or rectangular ion beam without mass separation through the oxide film, so that a separation layer is formed;
adding a second ion subjected to mass separation to parts of the separation layer formed in the single crystal semiconductor substrate by scanning with a spot ion beam, so that at least two high concentration regions each having a linear shape are formed in parallel to each other;
forming an insulating layer over a surface of the oxide film;
disposing one surface of the single crystal semiconductor substrate and a surface of a base substrate to face each other in order to bond a surface of the insulating layer and the surface of the base substrate; and
cleaving the single crystal semiconductor substrate using the separation layer as a cleavage plane, so that a single crystal semiconductor layer is formed over the base substrate,
wherein a mass number of the second ion is the same as or larger than a mass number of the first ion.

11. The method for manufacturing an SOI substrate according to claim 10, wherein the first ion is added by an ion doping method, and the second ion is added by an ion implantation method.

12. The method for manufacturing an SOI substrate according to claim 10, wherein the parts of the separation layer where the second ion is selectively added include an edge of the single crystal semiconductor substrate or a vicinity of an edge of the single crystal semiconductor substrate.

13. The method for manufacturing an SOI substrate according to claim 10, wherein $H^+$, $H_2^+$, and $H_3^+$ are used as the first ion.

14. The method for manufacturing an SOI substrate according to claim 10, wherein $H_3^+$ or $He^+$ obtained by mass separation is used as the second ion.

15. The method for manufacturing an SOI substrate according to claim 10, wherein after the single crystal semiconductor layer is formed over the base substrate, a surface of the single crystal semiconductor layer is irradiated with laser light in an inert atmosphere.

16. The method for manufacturing an SOI substrate according to claim 10, wherein the one surface of the single crystal semiconductor substrate is a {110} plane.

17. The method for manufacturing an SOI substrate according to claim 10, wherein a glass substrate is used as the base substrate.

18. The method for manufacturing an SOI substrate according to claim 10, wherein a silicon oxide film formed using an organosilane gas by a chemical vapor deposition method is used for the insulating layer.

19. A method for manufacturing an SOI substrate comprising the steps of:
forming an oxide film over an entire surface of a single crystal semiconductor substrate by performing heat treatment;
adding a first ion to the single crystal semiconductor substrate by irradiation of the single crystal semiconductor substrate with a planar, linear, or rectangular ion beam without mass separation through the oxide film, so that a separation layer is formed;
adding a second ion subjected to mass separation to parts of the separation layer formed in the single crystal semiconductor substrate by scanning with a spot ion beam, so that at least two high concentration regions each having a dot shape are formed;
disposing one surface of the single crystal semiconductor substrate and a surface of a base substrate to face each other in order to bond a surface of an insulating layer formed over the single crystal semiconductor substrate and the surface of the base substrate; and
cleaving the single crystal semiconductor substrate using the separation layer as a cleavage plane, so that a single crystal semiconductor layer is formed over the base substrate,
wherein a mass number of the second ion is the same as or larger than a mass number of the first ion, and
wherein the at least two high concentration regions each having the dot shape are distributed uniformly.

20. The method for manufacturing an SOI substrate according to claim 19, wherein the first ion is added by an ion doping method, and the second ion is added by an ion implantation method.

21. The method for manufacturing an SOI substrate according to claim 19, wherein the parts of the separation layer where the second ion is selectively added include an edge of the single crystal semiconductor substrate or a vicinity of an edge of the single crystal semiconductor substrate.

22. The method for manufacturing an SOI substrate according to claim 19, wherein $H^+$, $H_2^+$, and $H_3^+$ are used as the first ion.

23. The method for manufacturing an SOI substrate according to claim 19, wherein $H^+$, $H_2^+$, and $H_3^+$ obtained by mass separation is used as the second ion.

24. The method for manufacturing an SOI substrate according to claim 19, wherein after the single crystal semiconductor layer is formed over the base substrate, a surface of the single crystal semiconductor layer is irradiated with laser light in an inert atmosphere.

25. The method for manufacturing an SOI substrate according to claim 19, wherein the one surface of the single crystal semiconductor substrate is a {110} plane.

26. The method for manufacturing an SOI substrate according to claim 19, wherein a glass substrate is used as the base substrate.

27. The method for manufacturing an SOI substrate according to claim 19, wherein a silicon oxide film formed using an organosilane gas by a chemical vapor deposition method is used for the insulating layer.

28. A method for manufacturing an SOI substrate comprising the steps of:
- forming an oxide film over an entire surface of a single crystal semiconductor substrate by performing heat treatment in an oxidative atmosphere containing halogen;
- adding a first ion to the single crystal semiconductor substrate by irradiation of the single crystal semiconductor substrate with a planar, linear, or rectangular ion beam without mass separation through the oxide film, so that a separation layer is formed;
- adding a second ion subjected to mass separation to parts of the separation layer formed in the single crystal semiconductor substrate by scanning with a spot ion beam, so that at least two high concentration regions each having a dot shape are formed;
- forming an insulating layer over a surface of the oxide film;
- disposing one surface of the single crystal semiconductor substrate and a surface of a base substrate to face each other in order to bond a surface of the insulating layer and the surface of the base substrate; and
- cleaving the single crystal semiconductor substrate using the separation layer as a cleavage plane, so that a single crystal semiconductor layer is formed over the base substrate,
- wherein a mass number of the second ion is the same as or larger than a mass number of the first ion, and
- wherein the at least two high concentration regions each having the dot shape are distributed uniformly.

29. The method for manufacturing an SOI substrate according to claim 28, wherein the first ion is added by an ion doping method, and the second ion is added by an ion implantation method.

30. The method for manufacturing an SOI substrate according to claim 28, wherein the parts of the separation layer where the second ion is selectively added include an edge of the single crystal semiconductor substrate or a vicinity of an edge of the single crystal semiconductor substrate.

31. The method for manufacturing an SOI substrate according to claim 28, wherein $H^+$, $H_2^+$, and $H_3^+$ are used as the first ion.

32. The method for manufacturing an SOI substrate according to claim 28, wherein $H_3^+$ or $He^+$ obtained by mass separation is used as the second ion.

33. The method for manufacturing an SOI substrate according to claim 28, wherein after the single crystal semiconductor layer is formed over the base substrate, a surface of the single crystal semiconductor layer is irradiated with laser light in an inert atmosphere.

34. The method for manufacturing an SOI substrate according to claim 28, wherein the one surface of the single crystal semiconductor substrate is a {110} plane.

35. The method for manufacturing an SOI substrate according to claim 28, wherein a glass substrate is used as the base substrate.

36. The method for manufacturing an SOI substrate according to claim 28, wherein a silicon oxide film formed using an organosilane gas by a chemical vapor deposition method is used for the insulating layer.

* * * * *